(12) United States Patent
Tanaka et al.

(10) Patent No.: US 7,078,281 B2
(45) Date of Patent: Jul. 18, 2006

(54) METHOD OF MANUFACTURING A SEMICONDUCTOR DEVICE BY PROVIDING A MIRROR IN THE ATTENUATION REGION

(75) Inventors: Koichiro Tanaka, Kanagawa (JP); Tomoaki Moriwaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/227,922

(22) Filed: Aug. 27, 2002

(65) Prior Publication Data

US 2003/0042430 A1    Mar. 6, 2003

(30) Foreign Application Priority Data

Aug. 31, 2001    (JP)    ............................... 2001-264561

(51) Int. Cl.
*H01L 21/00*    (2006.01)
(52) U.S. Cl. ...................... 438/166; 438/149; 438/795
(58) Field of Classification Search ................ 438/166, 438/308, 378, 487, 489, 795, 949, 969
See application file for complete search history.

(56) References Cited

U.S. PATENT DOCUMENTS

| | | | |
|---|---|---|---|
| 4,861,964 A | | 8/1989 | Sinohara |
| 5,084,888 A | * | 1/1992 | Tajima et al. ................. 372/39 |
| 5,307,184 A | * | 4/1994 | Nishiwaki et al. ............ 359/30 |
| 5,708,252 A | | 1/1998 | Shinohara et al. |
| 5,815,494 A | * | 9/1998 | Yamazaki et al. ............ 372/25 |
| 5,893,990 A | | 4/1999 | Tanaka |
| 5,932,118 A | * | 8/1999 | Yamamoto et al. .... 291/121.66 |
| 5,970,368 A | * | 10/1999 | Sasaki et al. ................ 438/487 |
| 6,087,277 A | * | 7/2000 | Shih et al. ................... 438/795 |
| 6,117,752 A | * | 9/2000 | Suzuki ........................ 438/487 |
| 6,172,820 B1 | * | 1/2001 | Kuwahara ................... 359/719 |
| 6,187,088 B1 | * | 2/2001 | Okumura ........................ 117/8 |
| 6,249,385 B1 | | 6/2001 | Yamazaki et al. |

(Continued)

FOREIGN PATENT DOCUMENTS

JP    09-270393    10/1997

(Continued)

OTHER PUBLICATIONS

Australian Patent Office Search Report and Written Opinion for Singapore Patent Application Serial No. 200204790-0 mailed on Jun. 17, 2004.

*Primary Examiner*—Michael Lebentritt
*Assistant Examiner*—Stanetta Isaac
(74) *Attorney, Agent, or Firm*—Nixon Peabody LLP; Jeffrey L. Costellia

(57) ABSTRACT

Attenuation regions of laser light are removed or reduced in size using a slit located in the immediate vicinity of a surface to be irradiated so that a steep energy distribution is obtained in the end portions of the laser light. The reason why the slit is located in the immediate vicinity of the surface to be irradiated is to suppress the spread of the laser light. In addition, the attenuation regions of the laser light are folded by using a mirror instead of the slit to increase energy densities in the attenuation regions by one another so that a steep energy density distribution is obtained in the end portions of the laser light.

34 Claims, 19 Drawing Sheets

U.S. PATENT DOCUMENTS

| | | | |
|---|---|---|---|
| 6,341,042 B1 * | 1/2002 | Matsunaka et al. | 359/618 |
| 6,373,870 B1 * | 4/2002 | Yamazaki et al. | 372/25 |
| 6,396,560 B1 * | 5/2002 | Noguchi et al. | 349/187 |
| 6,429,100 B1 * | 8/2002 | Yoneda | 438/487 |
| 6,482,722 B1 * | 11/2002 | Kunii et al. | 438/487 |
| 6,731,371 B1 * | 5/2004 | Shiraishi | 355/30 |

FOREIGN PATENT DOCUMENTS

| | | |
|---|---|---|
| JP | 09-321311 | 12/1997 |
| JP | 11-212021 | 8/1999 |
| JP | 11-283933 | 10/1999 |
| JP | 2000-058478 | 2/2000 |
| JP | 2001-156017 | 6/2001 |

* cited by examiner

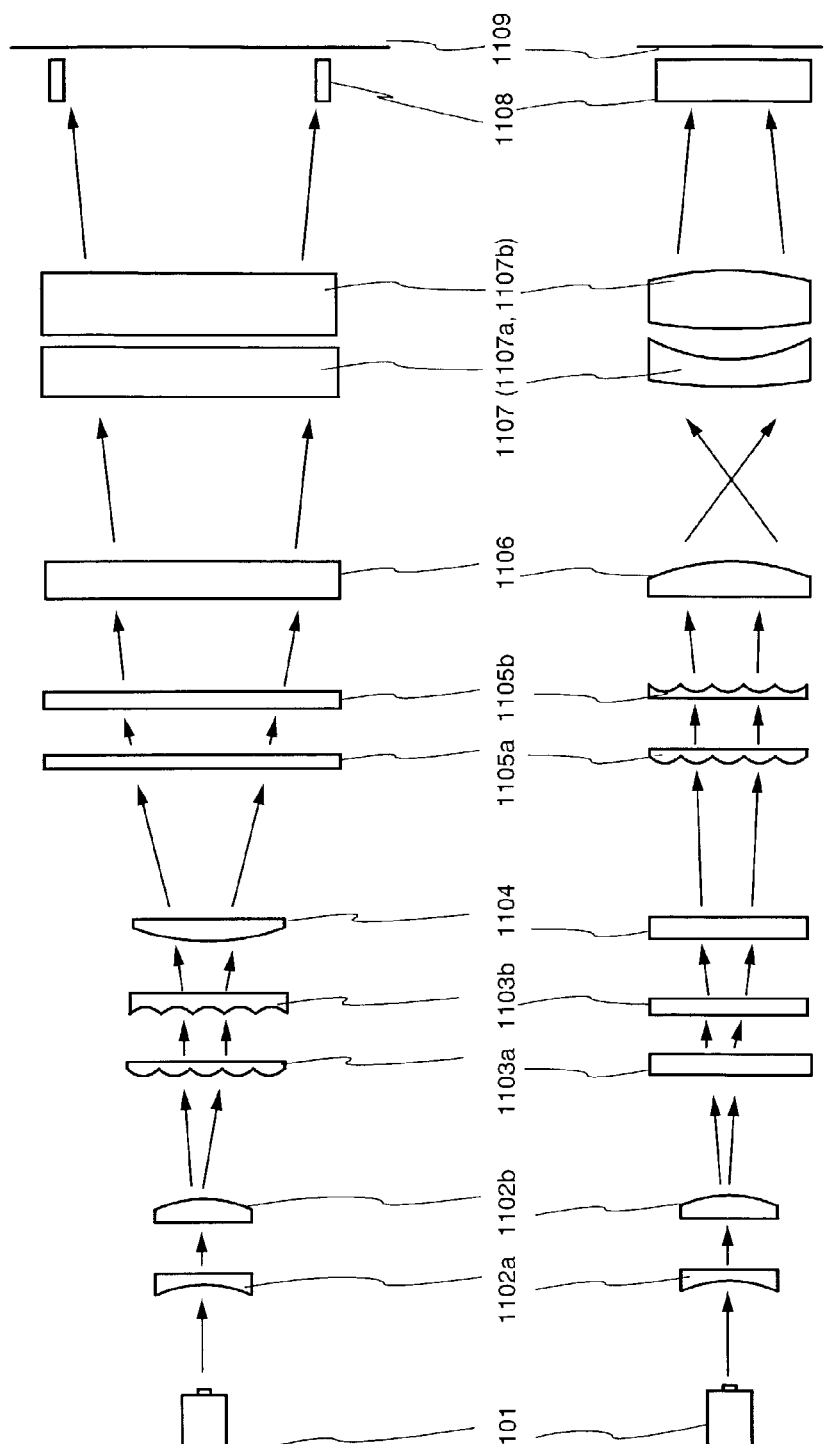

laser light
large area substrate
shift direction of the laser light with respect to the substrate a portion in which the laser scannings are adjacent to each other a portion in which the laser scannings are adjacent to each other top view side view source driver portion gate driver portion pixel portion large area substrate

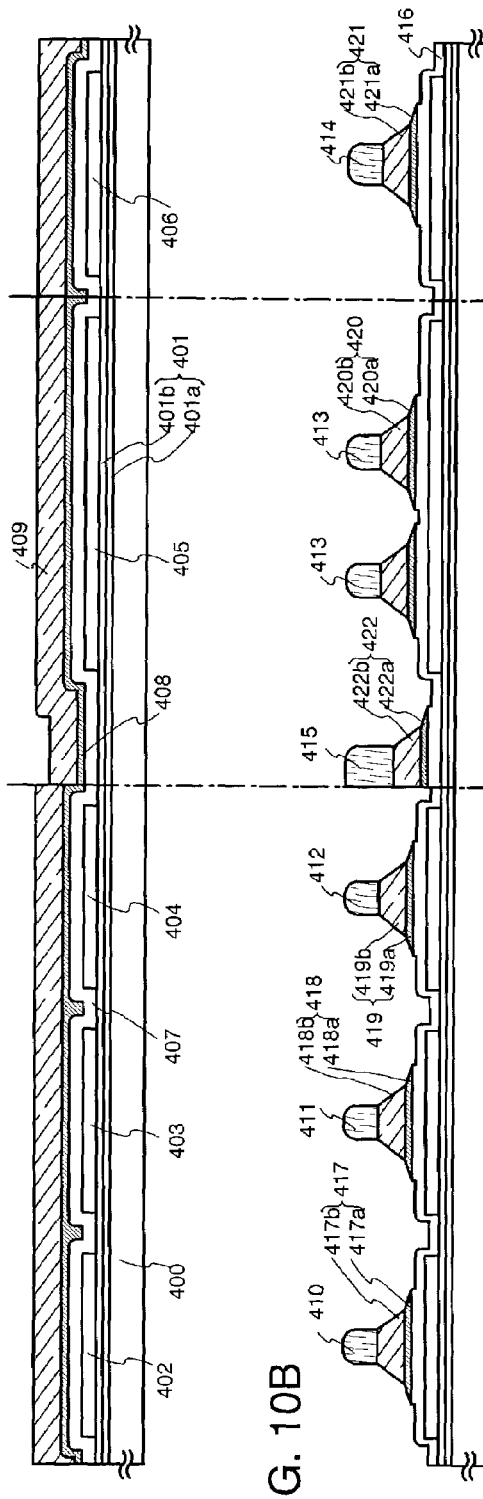
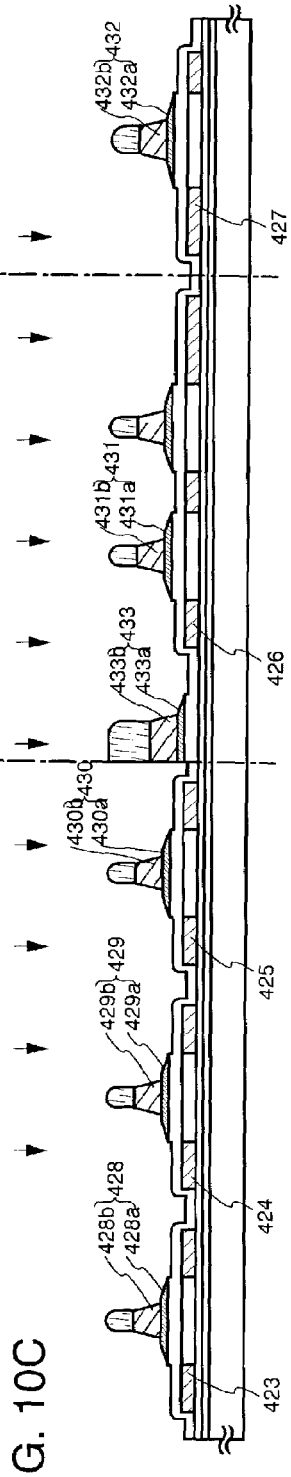
FIG. 10A
FIG. 10B
FIG. 10C

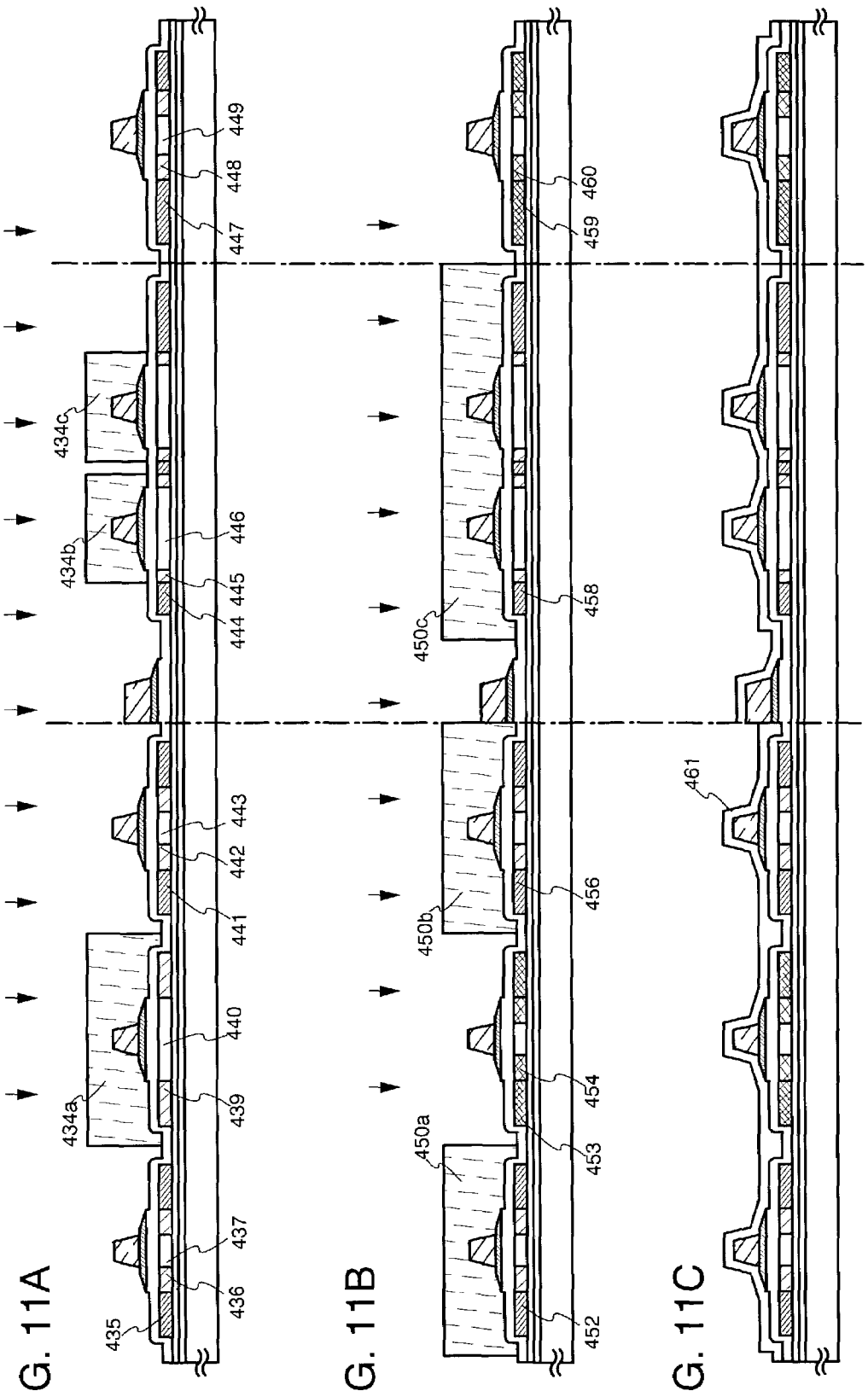

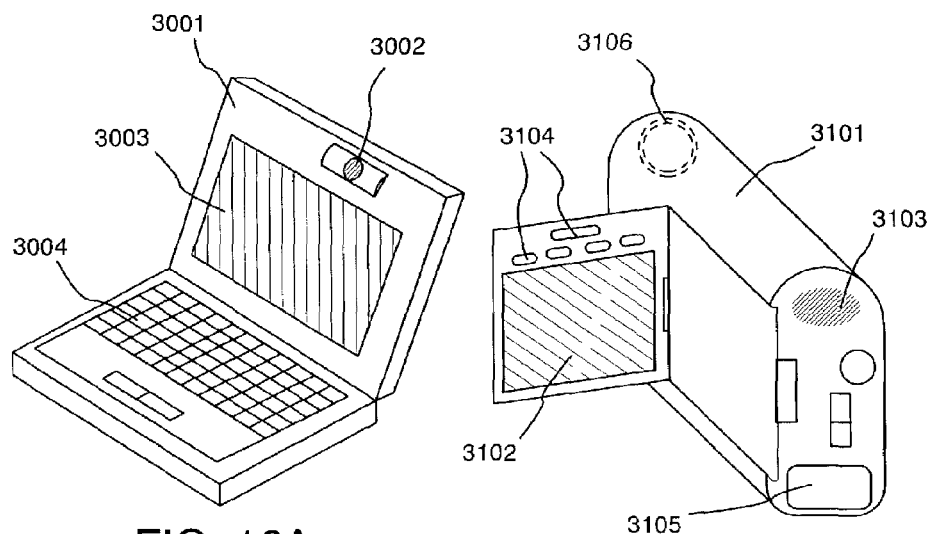
FIG. 16A
FIG. 16B
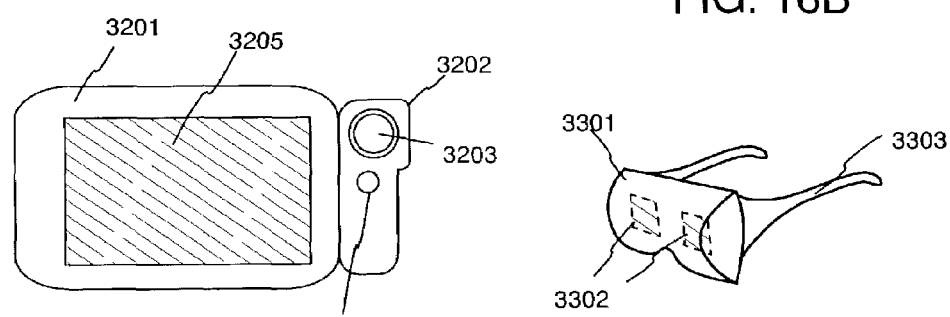
FIG. 16C
FIG. 16D
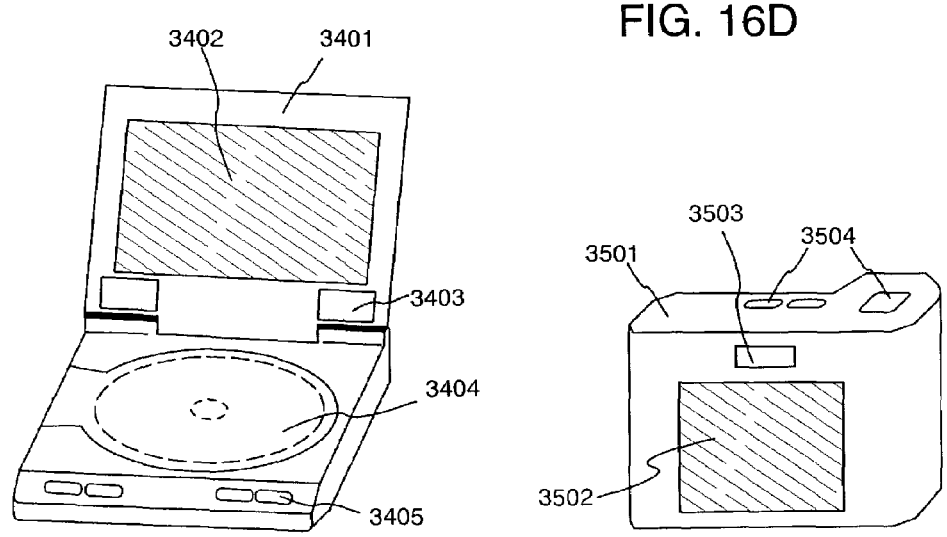
FIG. 16E
FIG. 16F

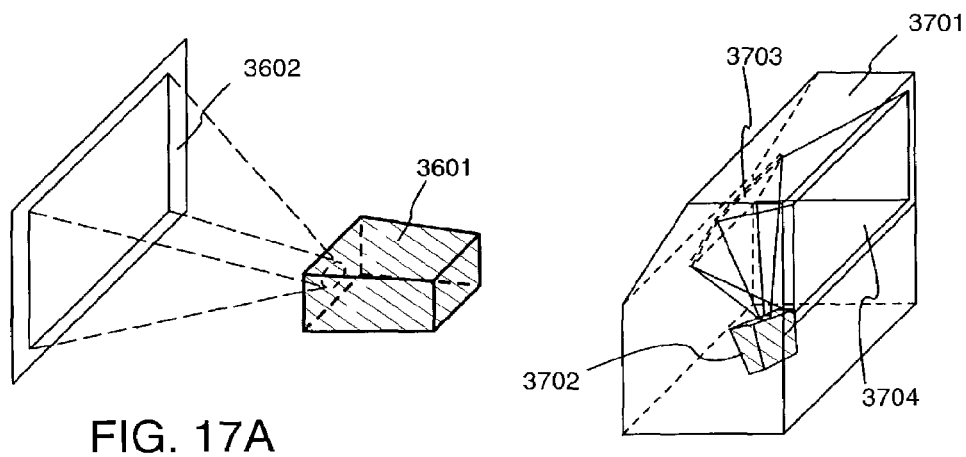
FIG. 17A
FIG. 17B
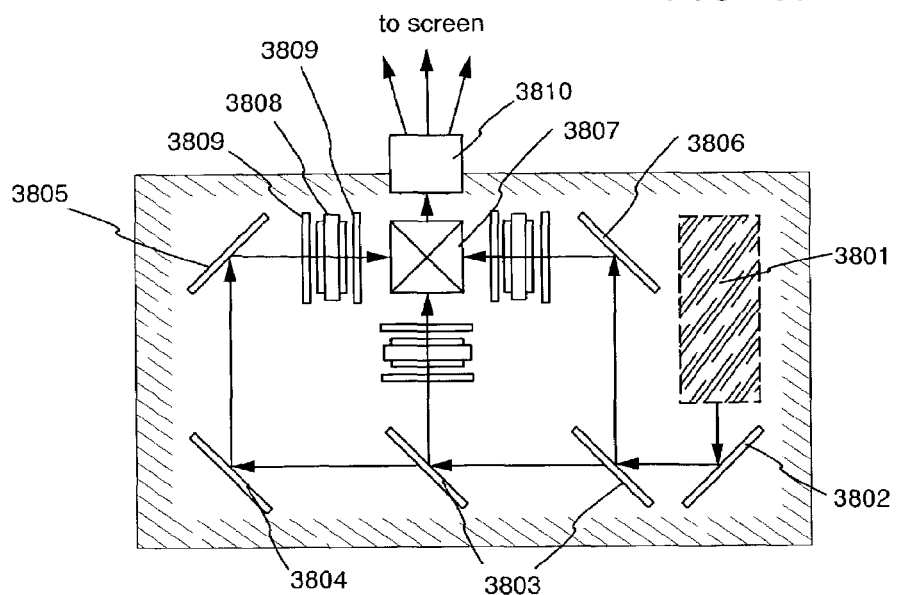
FIG. 17C
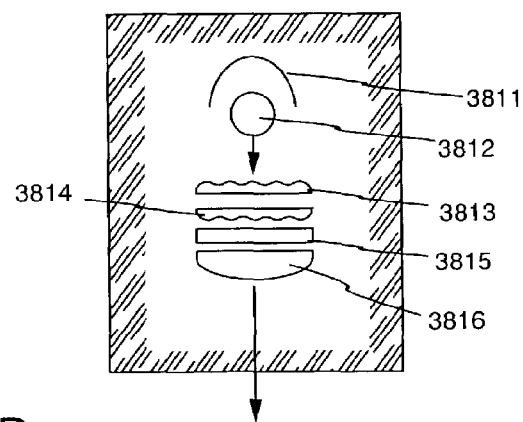
FIG. 17D

METHOD OF MANUFACTURING A SEMICONDUCTOR DEVICE BY PROVIDING A MIRROR IN THE ATTENUATION REGION

BACKGROUND OF THE INVENTION

1. Field of the Invention

The present invention relates to a laser irradiation method and a laser irradiation apparatus for using the method (apparatus including a laser and an optical system for guiding laser light emitted from the laser to an object to be irradiated). In addition, the present invention relates to a method of manufacturing a semiconductor device, which includes a laser light irradiation step. Note that a semiconductor device described here includes an electro-optical device such as a liquid crystal display device or a light emitting device and an electronic device which includes the electro-optical device as a part.

2. Description of the Related Art

In recent years, a wide study has been made on a technique in which laser annealing is performed for a semiconductor film formed on an insulating substrate made of glass or the like, to crystallize the film, to improve its crystallinity so that a crystalline semiconductor film is obtained, or to activate an impurity element. Note that a crystalline semiconductor film in this specification indicates a semiconductor film in which a crystallized region is present, and also includes a semiconductor film which is crystallized as a whole.

A method of forming pulse laser light from an excimer laser or the like by an optical system such that it becomes a square spot of several cm or a linear shape of 100 mm or more in length on a surface to be irradiated, and scanning the laser light (or relatively shifting an irradiation position of the laser light with respect to the surface to be irradiated) to conduct annealing is superior in mass productivity and is excellent in technology. The "linear shape" described here means not a "line" in the strict sense but a rectangle (or a prolate ellipsoid shape) having a high aspect ratio. For example, it indicates a shape having an aspect ratio of 10 or more (preferably, 100 to 10000). Note that the linear shape is used to obtain an energy density required for sufficiently annealing an object to be irradiated. Thus, if sufficient annealing is conducted for the object to be irradiated, it may be a rectangular shape or a sheet shape. Under the present conditions, an excimer laser of 15 J/pulse is on the market. In the future, there is also a possibility that annealing with sheet shaped laser light is conducted.

FIGS. 7A and 7B show an example of a configuration of an optical system for forming laser light in a linear shape on a surface to be irradiated. This configuration is extremely general. All optical systems described above are based on the configuration shown in FIGS. 7A and 7B. According to the configuration, a cross sectional shape of laser light is converted into a linear shape, and simultaneously an energy density distribution of laser light on the surface to be irradiated is homogenized. In general, an optical system for homogenizing the energy density distribution of laser light is called a beam homogenizer.

Laser light emitted from a laser 101 is divided in a direction perpendicular to a traveling direction thereof by a cylindrical lens group (hereinafter referred to as a cylindrical lens array) 103, thereby determining a length of linear laser light in a longitudinal direction. The direction is called a first direction in this specification. It is assumed that, when a mirror is inserted in a course of an optical system, the first direction is changed in accordance with a direction of light bent by the mirror. In the configuration shown in the top view of FIG. 7A, the cylindrical lens array is divided into seven parts. Then, the laser lights are synthesized on a surface to be irradiated 109 by a cylindrical lens 105, thereby homogenizing an energy density distribution of the linear laser light in the longitudinal direction.

Next, the configuration shown in the cross sectional view of FIG. 7B will be described. Laser light emitted from a laser 101 is divided in a direction perpendicular to a traveling direction thereof and the first direction by cylindrical lens arrays 102a and 102b, thereby determining a length of linear laser light in a width direction. The direction is called a second direction in this specification. It is assumed that, when a mirror is inserted in a course of an optical system, the second direction is changed in accordance with a direction of light bent by the mirror. In the cross sectional view of FIG. 7B, the cylindrical lens arrays 102a and 102b each are divided into four parts. The divided laser lights are temporarily synthesized by a cylindrical lens 104. After that, the laser lights are reflected by a mirror 107 and then condensed by a doublet cylindrical lens 108 so that they become again single laser light on the surface to be irradiated 109. The doublet cylindrical lens 108 is a lens composed of two cylindrical lenses. Thus, an energy density distribution of the linear laser light in a width direction is homogenized.

For example, an excimer laser in which a size in a laser window is 10 mm×30 mm (which each are a half-width in beam profile) is used as the laser 101 and laser light is produced by the optical system having the configuration shown in FIGS. 7A and 7B. Then, linear laser light which has a uniform energy density distribution and a size of 125 mm×0.4 mm can be obtained on the surface to be irradiated 109.

At this time, when, for example, quartz is used for all base materials of the optical system, high transmittance is obtained. Note that coating is preferably conducted for the optical system such that transmittance of 99% or more is obtained at a frequency of the used excimer laser.

Then, the linear laser light formed by the above configuration is irradiated with an overlap state while being gradually shifted in a width direction thereof. Thus, when laser annealing is performed for the entire surface of an amorphous semiconductor film, the amorphous semiconductor film can be crystallized, crystallinity can be improved to obtain a crystalline semiconductor film, or an impurity element can be activated.

Also, an area of a substrate used for manufacturing a semiconductor device is being increased more and more. This is because high throughput and a low cost can be realized in the case where a plurality of semiconductor devices such as liquid crystal display device panels are manufactured from a single large area substrate as compared with, for example, the case where TFTs for a pixel portion and driver circuits (source driver portion and gate driver portion) are formed on a single glass substrate, thereby manufacturing a single semiconductor device such as a liquid crystal display device panel (FIG. 9). At the present time, for example, a substrate of 600 mm×720 mm, a circular substrate of 12 inches (about 300 mm in diameter), etc. are used as the large area substrate. Further, it is expected that a substrate in which a length of one side exceeds 1000 mm will be also used in future.

In end portions of linear, rectangular shaped, or sheet shaped laser light produced on the surface to be irradiated or its vicinity by the optical system, an energy density is gradually attenuated by an aberration of a lens or the like (FIG. 8A). In this specification, regions in which an energy density is gradually attenuated in end portions of linear, rectangular shaped, or sheet shaped laser light is called attenuation regions.

Also, with increase in an area of a substrate and an output of a laser, longer linear laser light, longer rectangular-shaped laser light, and larger sheet-shaped laser light are being produced. This is because high efficiency is obtained in the case where annealing using such laser light is conducted. However, an energy density in end portions of laser light emitted from an oscillating laser is lower than that in a substantially central region thereof. Thus, when an area of the laser light is expanded to be equal to or larger than an area up to now by the optical system, the attenuation regions tend to be increasingly noticeable.

In the attenuation regions of laser light, the energy density is insufficient as compared with a region having high homogeneity of an energy density and is gradually attenuated. Thus, when annealing is conducted using laser light having the attenuation regions, uniform annealing cannot be conducted for an object to be irradiated (FIG. 8B). In addition, even when annealing is conducted by a method of performing scanning with attenuation region overlapping of the laser light, the annealing condition is distinctly different from that for the region having the high homogeneity of the energy density. Thus, uniform annealing cannot be still conducted for the object to be irradiated. Therefore, the same treatment cannot be conducted for a region of the object annealed by the attenuation regions of the laser light and another region of the object annealed by the region of the laser light having the high homogeneity of the energy density.

For example, when the object to be irradiated is a semiconductor film, crystallinity of a region of the film annealed by the attenuation regions of the laser light is different from that of another region of the film annealed by the region of the laser light having the high homogeneity of the energy density. Thus, even when TFTs are manufactured from such a semiconductor film, electrical characteristics of TFTs manufactured from the region of the film annealed by the attenuation regions of the laser light are deteriorated and this becomes a factor for causing a variation of TFTs on the same substrate. Actually, there is almost no such a case where the TFTs are manufactured from the region of the film annealed by the attenuation regions of the laser light to produce a semiconductor device. Thus, this becomes a factor for decreasing the number of usable TFTs per substrate, thereby reducing throughput.

SUMMARY OF THE INVENTION

Therefore, an object of the present invention is to provide a laser irradiation apparatus capable of removing attenuation regions in end portions of laser light to conduct annealing at high efficiency. In addition, an object of the present invention is to provide a laser irradiation method using such a laser irradiation apparatus and a method of manufacturing a semiconductor device, which includes a step corresponding to the laser irradiation method.

According to the present invention, as shown in FIG. 1A, attenuation regions of laser light, particularly, attenuation regions in portions of the laser light parallel to a shift direction thereof are removed or reduced using a slit located in the immediate vicinity of a surface to be irradiated so that a steep energy density distribution is obtained in the end portions of the laser light as shown in FIG. 2A. The reason why the slit is located in the immediate vicinity of the surface to be irradiated is to suppress the spread of the laser light. Thus, the slit is closed to a substrate within a permissible range of an apparatus (typically, within 1 cm). The slit may be located in contact with the surface to be irradiated. Further, according to the present invention, the attenuation regions of the laser light are folded by using a mirror as shown in FIG. 1B to increase energy densities in the attenuation regions and to reduce areas of the attenuation regions so that a steep energy density distribution is obtained in the end portions of the laser light.

If steep attenuation regions are obtained in the end portions of the laser light, particularly, in portions of the laser light parallel to a shift direction thereof, the laser light has high homogeneity of the energy density so that uniform annealing can be conducted for the object to be irradiated and efficient annealing is possible (FIG. 2B).

According to a structure of a laser irradiation apparatus disclosed in this specification, the laser irradiation apparatus is characterized by comprising: a laser; first means for converting a first energy density distribution of laser light emitted from the laser on a surface to be irradiated into a second energy density distribution; and second means for homogenizing an energy density in an end portion of the laser light having the second energy density distribution, in which the second means is provided between the surface to be irradiated and the first means.

Also, according to another structure of the laser irradiation apparatus disclosed in this specification, the laser irradiation apparatus is characterized by comprising: a laser; first means for changing a sectional shape of laser light emitted from the laser into a first shape to irradiate it to a surface to be irradiated; and second means for homogenizing an energy density in an end portion of the laser light which is changed into the first shape, in which the second means is provided between the optical system and the surface to be irradiated.

Also, according to a structure of a laser irradiation method disclosed in this specification, the laser irradiation method is characterized by comprising: converting a first energy density distribution of laser light emitted from a laser on a surface to be irradiated into a second energy density distribution by first means; and homogenizing an energy density in an end portion of the laser light having the second energy density distribution by second means and irradiating laser light having the homogenized energy density to the surface to be irradiated while relatively shifted.

Also, according to another structure of the laser irradiation method disclosed in this specification, the laser irradiation method is characterized by comprising: changing a sectional shape of laser light emitted from a laser into a first shape by first means to irradiate it to a surface to be irradiated; and homogenizing an energy density in an end portion of the laser light which is changed into the first shape by second means and irradiating laser light having the homogenized energy density to the surface to be irradiated while relatively shifted.

Furthermore, according to a structure of a method of manufacturing a semiconductor device disclosed in this specification, the manufacturing method is characterized by comprising: converting a first energy density distribution of laser light emitted from a laser on a surface to be irradiated into a second energy density distribution by first means; and homogenizing an energy density in an end portion of the laser light having the second energy density distribution by second means and irradiating laser light having the homogenized energy density to the surface to be irradiated while relatively shifted.

Also, according to another structure of method of manufacturing a semiconductor device disclosed in this specification, the manufacturing method is characterized by comprising: changing a sectional shape of laser light emitted from a laser into a first shape by first means to irradiate it to a surface to be irradiated; and homogenizing an energy density in an end portion of the laser light which is changed into the first shape by second means and irradiating laser light having the homogenized energy density to the surface to be irradiated while relatively shifted.

Also, in the above structure, it is characterized in that the first means is a homogenizer located to be orthogonal to an optical axis of the laser light.

Also, in the above structure, it is characterized in that the first means is a plurality of cylindrical lens arrays which are arranged in parallel so as to be orthogonal to an optical axis of the laser light and divide the laser light in the arrangement directions.

Also, in the above structure, it is characterized in that the optical system is composed of a plurality of cylindrical lens groups and a lens, the cylindrical lens groups are arranged in parallel so as to be orthogonal to an optical axis of the laser light and divide the laser light in the arrangement directions, and the lens is located in a transmission side of the cylindrical lens groups and synthesizes the divided laser lights.

Also, in the above structure, it is characterized in that the first means is a fly eye lens which is located to be orthogonal to an optical axis of the laser light and divides the laser light.

Also, in the above structure, it is characterized in that the first means is composed of a fly eye lens and a spherical lens, the fly eye lens is located to be orthogonal to an optical axis of the laser light and divides the laser light, and the spherical lens is located in a transmission side of the fly eye lens and synthesizes the divided laser lights.

Also, in the above structure, it is characterized in that the second means is one of a slit or a mirror, the slit is located adjacent to the surface to be irradiated, and the mirror is located corresponding to the end portion of the laser light having the second energy density distribution.

Also, in the above structure, it is characterized in that the end portion of the laser light is a region parallel to a shift direction of the laser light.

According to the above structure, the laser light may be converted into a harmonic by a non-linear optical element. For example, it is known that a YAG laser emits laser light having a wavelength of 1065 nm as a fundamental wave. An absorption coefficient of the laser light to a silicon film is very low. Thus, at this rate, it is technically difficult to crystallize an amorphous silicon film as one of semiconductor films. However, the laser light can be converted into light having a shorter wavelength by using a non-linear optical element. As harmonic, there is the second harmonic (532 nm), the third harmonic (355 nm), the fourth harmonic (266 nm), or the fifth harmonic (213 nm). These harmonics have a high absorption coefficient to an amorphous silicon film. Thus, they can be used for crystallizing the amorphous silicon film.

In the above structure, it is characterized in that the laser is one selected from the group consisting of a continuous oscillation solid laser, a continuous oscillation gas laser, a pulse oscillation solid laser, and a pulse oscillation gas laser. Note that, as the solid laser, there are enumerated a YAG laser, a $YVO_4$ laser, a YLF laser, a $YAlO_3$ laser, a glass laser, a ruby laser, an alexandrite laser, a Ti:sapphire laser, and the like, and as the gas laser, there are exemplified an excimer laser, an Ar laser, a Kr laser, and the like.

Also, in the above structure, the laser light may be converted into a harmonic by a non-linear optical element.

In the above structure, it is characterized in that the laser is one selected from the group consisting of a continuous oscillation solid laser, a continuous oscillation gas laser, a pulse oscillation solid laser, and a pulse oscillation gas laser. Note that, as the solid laser, there are enumerated a YAG laser, a $YVO_4$ laser, a YLF laser, a $YAlO_3$ laser, a glass laser, a ruby laser, an alexandrite laser, a Ti:sapphire laser, and the like, and as the gas laser, there are exemplified an excimer laser, an Ar laser, a Kr laser, and the like.

The slit is located in the immediate vicinity of the surface to be irradiated or on the surface to be irradiated or when the mirror is located in the attenuation regions of the laser light, typically, near the middle of the attenuation regions. Thus, superior homogeneity of an energy density distribution of the laser light on the surface to be irradiated or in its vicinity can be obtained so that uniform annealing can be conducted for the object to be irradiated.

Up to now, the divided laser lights are synthesized by the cylindrical lens 105 shown in FIGS. 7A and 7B to reduce the attenuation regions. According to the present invention, even when the cylindrical lens 105 is not provided to the optical system, a steep energy density distribution can be obtained in the end portions of the laser light. Thus, the number of lens used for the optical system is decreased so that optical adjustment is easy, and uniform annealing can be conducted. Note that, when the cylindrical lens 105 is used, the attenuation regions of the laser light can be reduced. Thus, areas of the laser light irradiated to, the slit located in the immediate vicinity of the surface to be irradiated or in contact with the surface to be irradiated, or the mirror located near the middle of the attenuation regions of the laser light, can be reduced. As a result, there is an effect that a mirror or a slit which has a smaller size can be used.

The uniform annealing is very important in order to uniform a property of the object to be irradiated. In addition, the present invention is particularly effective in the case where a large area substrate is annealed. For example, when laser light having a width shorter than a length of the large area substrate is irradiated to anneal the object to be irradiated, it is necessary to conduct relative scanning to the large area substrate plural times for annealing. The laser light produced by the present invention has a very superior energy distribution particularly in portions of the laser light parallel to a shift direction thereof. Thus, even in an adjacent portion of regions scanned by the laser light, annealing can be uniformly conducted. As a result, no variation in annealing is caused in any portion of the large area substrate so that it can be utilized without waste and throughput can be improved. For example, when a semiconductor film is formed on the large area substrate, a property of the semiconductor film produced by uniform annealing becomes uniform. Therefore, a variation in characteristics of TFTs manufactured from such a semiconductor film can be reduced. In addition, an operating characteristic and reliability of a semiconductor device manufactured from such TFTs can be improved.

BRIEF DESCRIPTION OF THE DRAWINGS

In the accompanying drawings:

FIGS. 3A and 3B show an example of an optical system of the present invention;

FIGS. 10A to 10C are sectional views showing steps of manufacturing pixel TFTs and driver circuit TFTs;

FIGS. 11A to 11C are sectional views showing steps of manufacturing the pixel TFTs and the driver circuit TFTs;

FIGS. 16A to 16F show examples of semiconductor devices;

FIGS. 17A to 17D show examples of semiconductor devices;

DETAILED DESCRIPTION OF THE PREFERRED EMBODIMENTS

Embodiment Mode

Figure 1A:
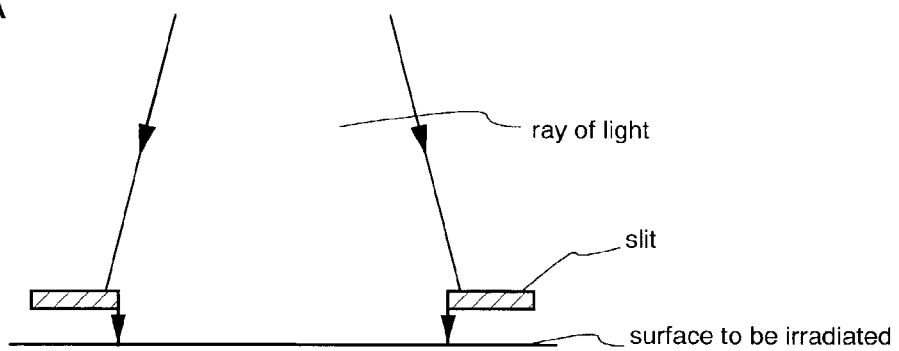
FIG. 1A shows an example of an optical path in the case where a slit is located and FIG. 1B shows an example of an optical path in the case where a mirror is located.

In this embodiment mode, a method of removing attenuation regions by a slit will be described using FIGS. 3A and 3B. FIG. 3A shows an optical system in the case where a longitudinal direction is viewed from a direction perpendicular thereto and FIG. 3B shows the optical system in the case where a width direction is viewed from a direction perpendicular thereto.

Laser light emitted from a laser 1101 is expanded by a beam expander (1102a and 1102b) in both the longitudinal direction and the width direction by about two times. Note that the beam expander is particularly effective in the case where a size of the laser light emitted from the laser is small. It may not be used according to a size or the like of the laser light.

The laser light emitted from the beam expander is incident into cylindrical lens arrays 1103a and 1103b and a cylindrical lens 1104 as first forming means. These three lenses are disposed such that a curvature of the laser light is parallel to the longitudinal direction thereof. Thus, an energy density distribution of the laser light is homogenized in the longitudinal direction.

The laser light emitted from the cylindrical lens 1104 is incident into a doublet cylindrical lens 1107, which is composed of cylindrical lens arrays 1105a and 1105b, a cylindrical lens 1106, and two cylindrical lenses 1107a and 1107b, as third forming means. These lenses are disposed such that a curvature of the laser light is parallel to the width direction thereof. Thus, an energy density distribution of the laser light is homogenized in the width direction and simultaneously a width thereof is shortened.

Then, a slit 1108 is located as a second forming means in the immediate vicinity of a surface to be irradiated. A width and a position of the slit 1108 is set such that an attenuation regions of the laser light are shielded by the slit 1108 and thereby do not reach a surface to be irradiated 1109. Thus, linear laser light having a steep energy density distribution in end portions thereof can be obtained.

When a semiconductor film is annealed using such a laser irradiation apparatus, it can be crystallized, crystallinity can be improved to obtain a crystalline semiconductor film, or an impurity element can be activated.

The slit is used in this embodiment mode. However, the present invention is not limited to this, and a mirror can also be used. When the mirror is used and located in the attenuation regions of the laser light, particularly, in the attenuation regions in portions of the laser light parallel to a shift direction thereof, typically, near the middle of the respective attenuation regions in a width direction, the laser light is reflected near the central portion of the respective attenuation regions. Energy densities of a non-reflecting area and a reflecting area in the attenuation regions are synthesized. Thus, the same energy density as a region having a homogenous energy density distribution can be obtained.

Also, when coating applied on a surface of synthetic quartz glass is changed for a suitable one in accordance with a wavelength of a laser used, various lasers can be applied to the present invention.

Note that laser light whose shape on a surface to be irradiated becomes linear is produced in this embodiment mode. However, the present invention is not limited to a linear shape. In addition, the shape is changed depending on a kind of laser light emitted from a laser. Thus, even if laser light is formed by the optical system, it is easy to receive the influence of an original shape. For example, laser light emitted from a XeCl excimer laser (308 nm in wavelength and 30 ns in pulse width) has a rectangular shape of 10 mm×30 mm (which each are a half-width in beam profile). With respect to a shape of laser light emitted from a solid laser, when a rod shape is cylindrical, the shape of laser light becomes circular. In addition, in the case of a slab type, the shape of laser light is rectangular. In any shape, if the laser light has an energy density enough to anneal an object to be irradiated, there is no problem and the present invention can be applied.

The present invention made by the above constitutions will be described in more detail through the following embodiments.

Embodiment 1

In this embodiment, a method of obtaining a steep energy density distribution in end portions of linear laser light by using a slit will be described using FIGS. 3A and 3B. FIG. 3A shows an optical system in the case where a longitudinal direction of laser light is viewed from a direction perpendicular thereto and FIG. 3B shows the optical system in the case where a width direction of laser light is viewed from a direction perpendicular thereto.

Note that in the description related to an arrangement of lenses in this specification, it is assumed that the front is a travel direction of laser light. In addition, with respect to the lenses, it is assumed that a laser light incident side surface is a first surface and an emission side surface is a second surface. A radius of curvature of the first surface is indicated by $R_1$ and a curvature radius of the second surface is indicated by $R_2$. A sign of the used radius of curvature is negative in the case where a center of curvature is located on a laser light incident side when it is viewed from the lens. In addition, the sign is positive in the case where the center of curvature is located on an emission side. In the case of a plane, ∞ is assumed. Further, all lenses used are made of synthesis quartz glass (1.485634 in refractive index). However, the present invention is not limited to this.

Laser light emitted from a laser 1101 is expanded by a beam expander in both the longitudinal direction and the width direction by about two times. The beam expander is composed of a spherical lens (50 mm in radius, 7 mm in thickness, $R_1$=−220 mm, and $R_2$=∞) 1102a and a spherical lens (50 mm in radius, 7 mm in thickness, $R_1$=∞, and $R_2$=−400 mm) 1102b which is located at a distance of 400 mm from the spherical lens 1102a.

The laser light emitted from the beam expander is incident into a cylindrical lens array 1103a which is located at a distance of 50 mm from the spherical lens 1102b of the beam expander toward the front. After that, the laser light is transmitted through a cylindrical lens array 1103b which is located at a distance of 88 mm from the cylindrical lens array 1103a toward the front, and then incident into a cylindrical lens 1104 which is located at a distance of 120 mm from the cylindrical lens array 1103b toward the front. The cylindrical lens array 1103a includes 40 cylindrical lenses (each having 60 mm in length, 2 mm in width, 5 mm in thickness, $R_1$=28 mm, and $R_2$=∞) located in array. The cylindrical lens array 1103b includes 40 cylindrical lenses (each having 60 mm in length, 2 mm in width, 5 mm in thickness, $R_1$=−13.33 mm, and $R_2$=∞) located in array. The cylindrical lens 1104 is a cylindrical lens having 150 mm in length, 60 mm in width, 20 mm in thickness, $R_1$=2140 mm, and $R_2$=∞. The cylindrical lens arrays 1103a and 1103b and the cylindrical lens 1104 each are disposed such that the curvature is parallel to the longitudinal direction. A light beam is divided by the cylindrical lens arrays 1103a and 1103b. The divided light beams are overlapped with each other by the cylindrical lens 1104 to homogenize an energy density distribution. Thus, the energy density distribution of the laser light is homogenized in the longitudinal direction by these three lenses.

The laser light emitted from the cylindrical lens 1104 is incident into a cylindrical lens array 1105a which is located at a distance of 395 mm from the cylindrical lens 1104 toward the front. After that, the laser light is transmitted through a cylindrical lens array 1105b which is located at a distance of 65 mm from the cylindrical lens array 1105a toward the front, and then incident into a cylindrical lens 1106 which is located at a distance of 1600 mm from the cylindrical lens array 1105b toward the front. The cylindrical lens array 1105a includes 16 cylindrical lenses (each having 150 mm in length, 2 mm in width, 5 mm in thickness, $R_1$=100 mm, and $R_2$=∞) located in array. The cylindrical lens array 1105b includes 16 cylindrical lenses (each having 150 mm in length, 2 mm in width, 5 mm in thickness, $R_1$=∞, and $R_2$=80 mm) located in array. The cylindrical lens 1106 is a cylindrical lens having 900 mm in length, 60 mm in width, 20 mm in thickness, $R_1$=∞, and $R_2$=−486 mm. The cylindrical lens arrays 1105a and 1105b and the cylindrical lens 1106 each are disposed such that the curvature is parallel to the width direction. By these three lenses, an energy density distribution of the laser light is homogenized in the width direction and simultaneously a width thereof is shortened. Thus, linear laser light having a width of 2 mm is produced at a distance of 800 mm from the cylindrical lens 1106 toward the front.

In order to further shorten the above linear laser light having the width of 2 mm, a doublet cylindrical lens 1107 is located at a distance of 2050 mm from the cylindrical lens 1106 toward the front. The doublet cylindrical lens 1107 is composed of two cylindrical lenses 1107a and 1107b. The cylindrical lens 1107a is a cylindrical lens having 400 mm in length, 70 mm in width, 10 mm in thickness, $R_1$=12 mm, and $R_2$=77 mm. The cylindrical lens 1107b is a cylindrical lens having 400 mm in length, 70 mm in width, 10 mm in thickness, $R_1$=97 mm, and $R_2$=−200 mm. In addition, the cylindrical lenses 1107a and 1107b are located at an interval of 5.5 mm. The cylindrical lenses 1107a and 1107b each are disposed such that the curvature is parallel to the width direction.

Linear laser light having 300 mm in length and 0.4 mm in width is produced on a surface 1109 at a distance of 237.7 mm from the doublet cylindrical lens 1107 toward the front. At this time, the produced linear laser light has an energy density distribution in which end portions thereof in the longitudinal direction are gradually attenuated. In order to remove such energy attenuation regions, a slit 1108 is located in the immediate vicinity of the surface to be irradiated. A width and a position of the slit 1108 are set such that light beams corresponding to the energy attenuation regions are blocked by the slit 1108 and thereby do not reach the surface to be irradiated 1109. Thus, linear laser light having a steep energy density distribution in end portions thereof can be obtained. In this embodiment, the slit is located at a distance of 2 mm from a substrate.

Figure 19:
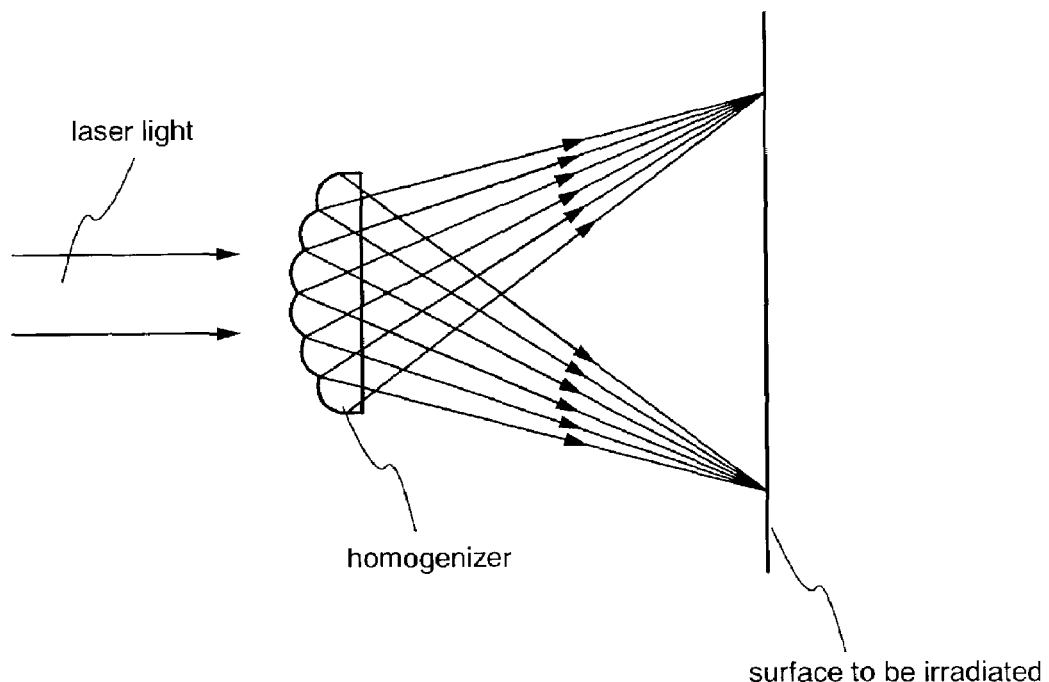
FIG. 19 shows an example of a homogenizer.

Also, instead of three lenses, that is, the cylindrical lens arrays 1103a and 1103b and the cylindrical lens 1104 or the cylindrical lens arrays 1105a and 1105b and the cylindrical lens 1106, a homogenizer shown in FIG. 19 may be used. Also when such a homogenizer is used, laser light on the surface to be irradiated or at its vicinity has attenuation regions in end portions. Thus, the slit is provided, thereby removing the attenuation regions to produce linear laser light having a steep energy density distribution.

When such a laser irradiation apparatus is used, uniform annealing can be conducted for the surface to be irradiated. For example, when annealing is conducted using a semiconductor film as an object to be irradiated, it can be crystallized, crystallinity can be improved to obtain a semiconductor film having uniform crystallinity, or an impurity element can be activated.

Embodiment 2

In this embodiment, a method of obtaining a steep energy density distribution in end portions of linear laser light by using a mirror will be described.

Figure 1B:
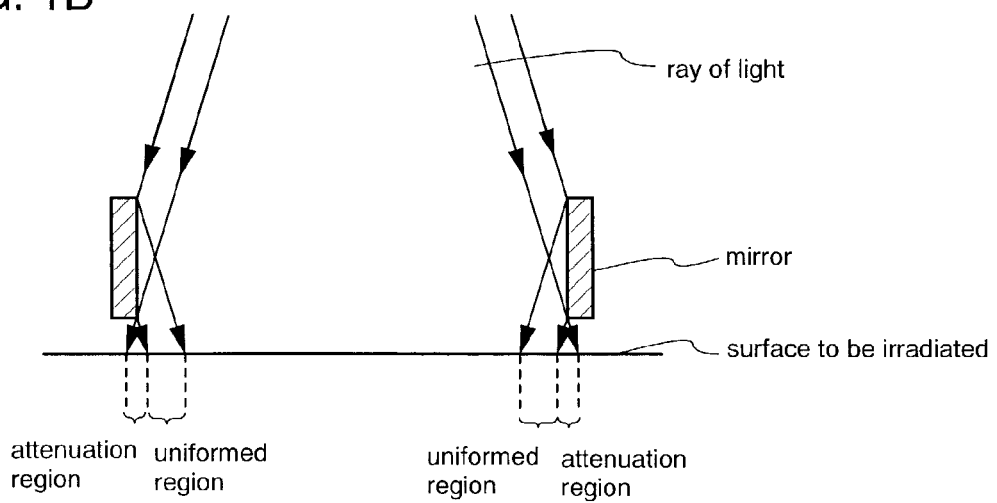
Figure 2A:
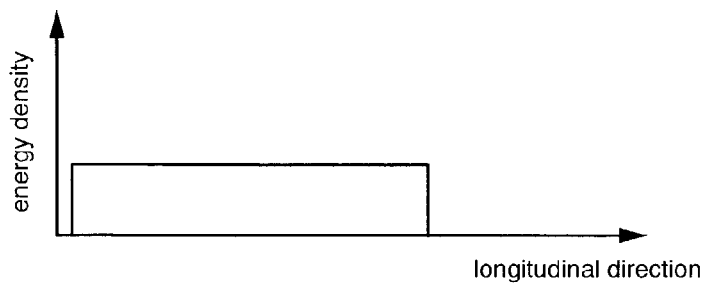
FIG. 2A shows an example of an energy density distribution of laser light according to the present invention and FIG. 2B shows an example in which a large area substrate is annealed using the laser light shown in FIG. 2A.
Figure 2B:
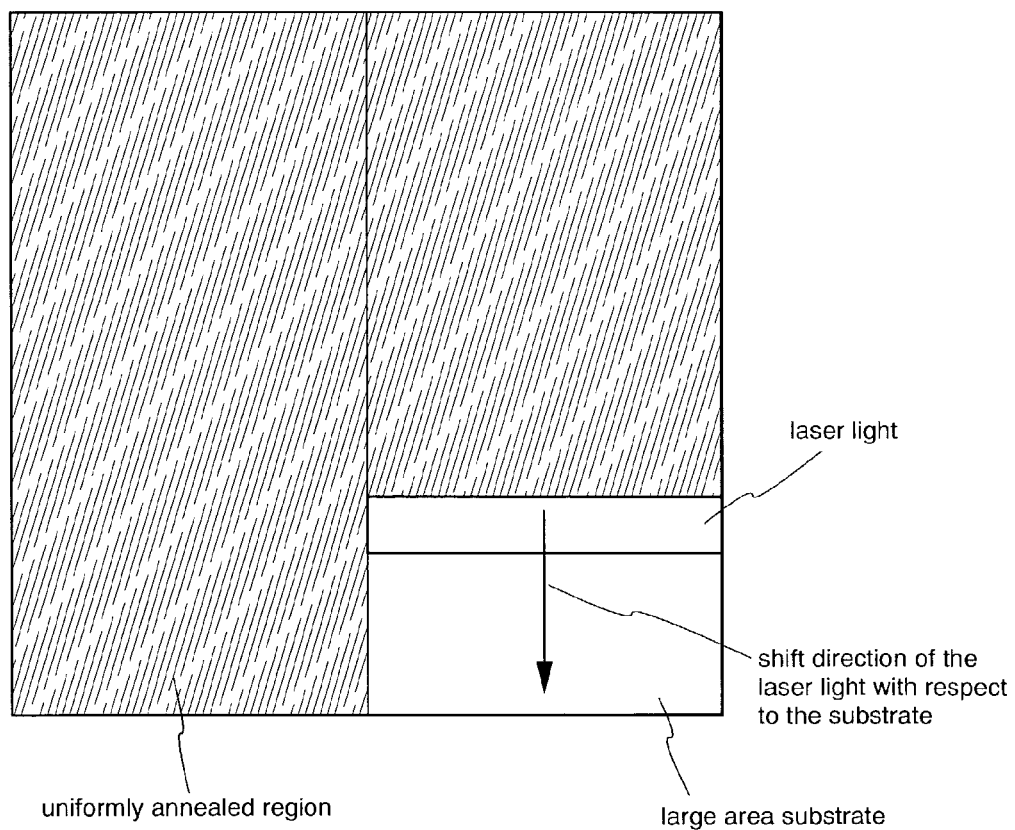

Linear laser light is produced by the optical system described in Embodiment 1. Note that, as shown in FIG. 1B, a mirror is provided on side surfaces of a slit and located near substantially central portions of energy attenuation regions. The light beams of the energy attenuation regions are reflected by the mirror to irradiate remaining energy attenuation regions. Thus, the attenuation regions are reduced so that the linear laser light having a steep energy density distribution in the end portions thereof is produced on the surface to be irradiated.

When such a laser irradiation apparatus is used, uniform annealing can be conducted for the surface to be irradiated.

For example, when annealing is conducted using a semiconductor film as an object to be irradiated, it can be crystallized, crystallinity can be improved to obtain a crystalline semiconductor film having uniform crystallinity, or an impurity element can be activated.

Embodiment 3

In this embodiment, a method of obtaining a steep energy density distribution in end portions of sheet shaped laser light will be described using FIGS. 4, 5A to 5F.

Figure 5A:
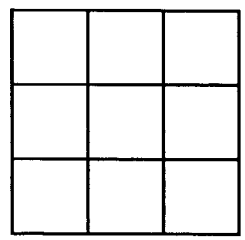
FIGS. 5A to 5F show an example of a fly eye lens.
Figure 5B:
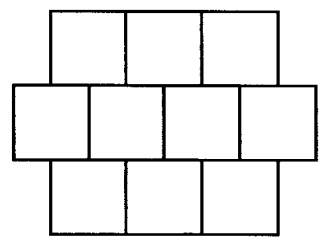
Figure 5C:
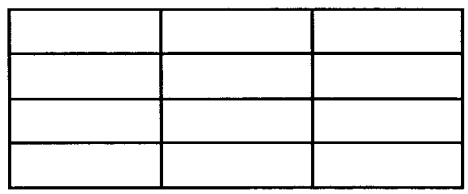
Figure 5D:
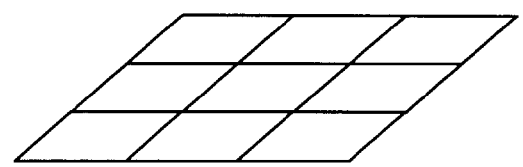
Figure 5E:
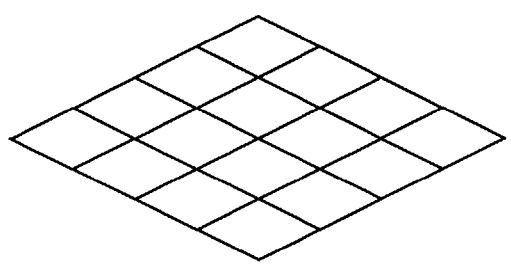
Figure 5F:
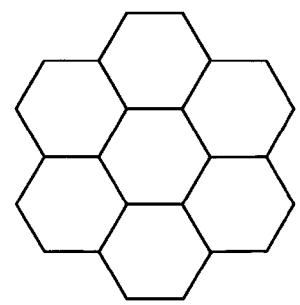

Laser light emitted from a laser 1101 is incident into a fly eye lens 1302. Note that, in order to set an aspect ratio of the incident laser light to 1:1, a cylindrical lens may be inserted as a beam expander between an oscillation apparatus and the fly eye lens. The fly eye lens 1302 is obtained by arranging spherical lenses each having $R_1$=10 mm, and $R_2$=∞, 5 mm in thickness, and 1 mm in square, as shown in FIG. 5A. Note that an arrangement of such an array is optimized to homogenize the energy distribution depending on a shape of the incident laser light (arrangement example: FIG. 5B). In addition, in order to make the array to be geometrically similar to a semiconductor film to be annealed, it is considered that a shape as shown in, for example, FIG. 5C (rectangle), FIG. 5D (parallelogram), FIG. 5E (rhombus), or FIG. 5F (regular hexagon) is used. A spherical lens 1303 is located at a distance of 20 mm from fly eye lens 1302 toward the front. The spherical lens 1303 has $R_1$=300 mm, and $R_2$=∞, 20 mm in thickness, and 150 mm in square.

Figure 4:
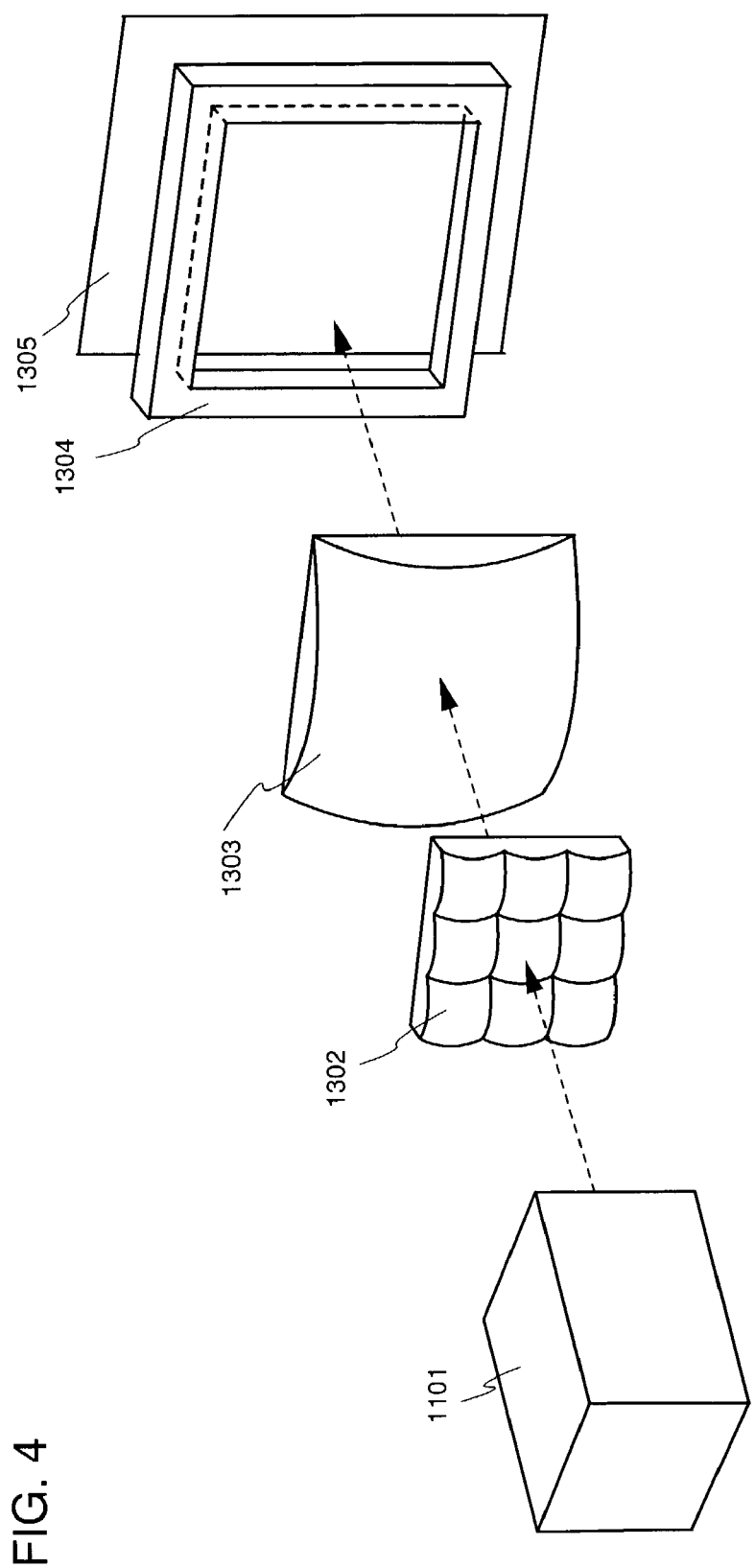
FIG. 4 shows an example of an optical system of the present invention.

The light beams divided by the fly eye lens 1302 are overlapped with each other by the spherical lens 1303. Thus, sheet shaped laser light of 30 mm×30 mm whose energy distribution is homogenized is produced on a surface to be irradiated 1305 at a distance of 600 mm from the fly eye lens 1302 toward the front. At this time, with respect to the produced sheet shaped laser light, energies in the end portions are attenuated. Therefore, in order to remove this, a slit 1304 is located in the immediate vicinity of the surface to be irradiated. FIG. 4 shows the slit 1304 when it is viewed from a light beam incident side. A width and a position of the slit 1304 are set such that light beams corresponding to the energy attenuation regions are blocked and thereby do not reach the surface to be irradiated 1305. Thus, sheet (square) shaped laser light having a steep energy density distribution in end portions thereof is produced on the surface to be irradiated 1305. In this embodiment, the slit is located at a distance of 2 mm from a substrate. Note that, even when the slit is replaced by the mirror, linear laser light or sheet shaped laser light can be similarly produced.

When such a laser irradiation apparatus is used, uniform annealing can be conducted for the surface to be irradiated. For example, when annealing is conducted using a semiconductor film as an object to be irradiated, it can be crystallized, crystallinity can be improved to obtain a crystalline semiconductor film having uniform crystallinity, or an impurity element can be activated.

Embodiment 4

Figure 6A:
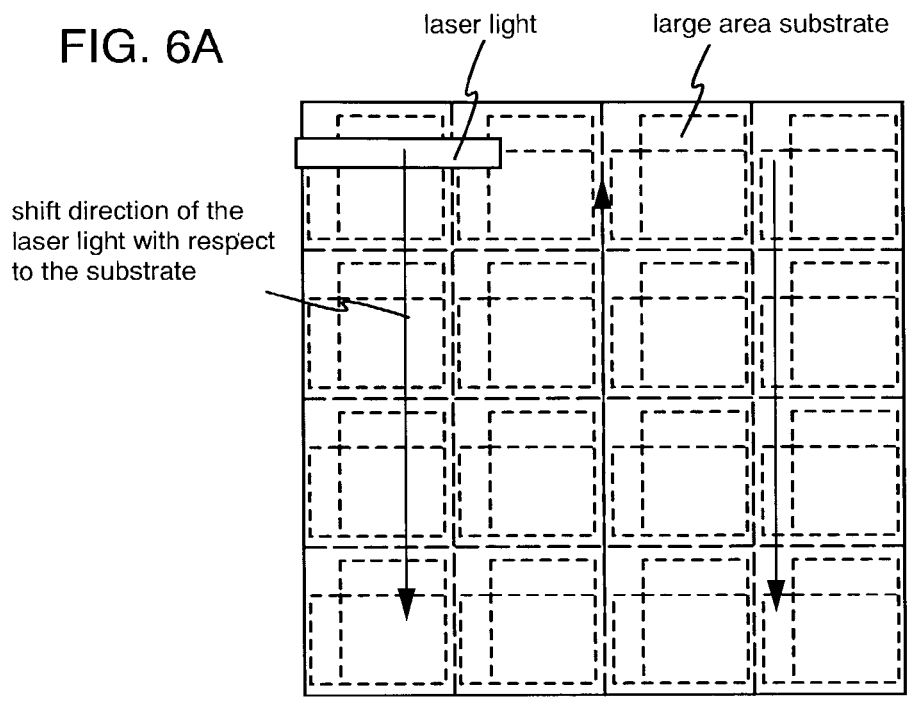
FIGS. 6A and 6B show an example in which a large area substrate is annealed using laser light produced by the present invention.
Figure 6B:
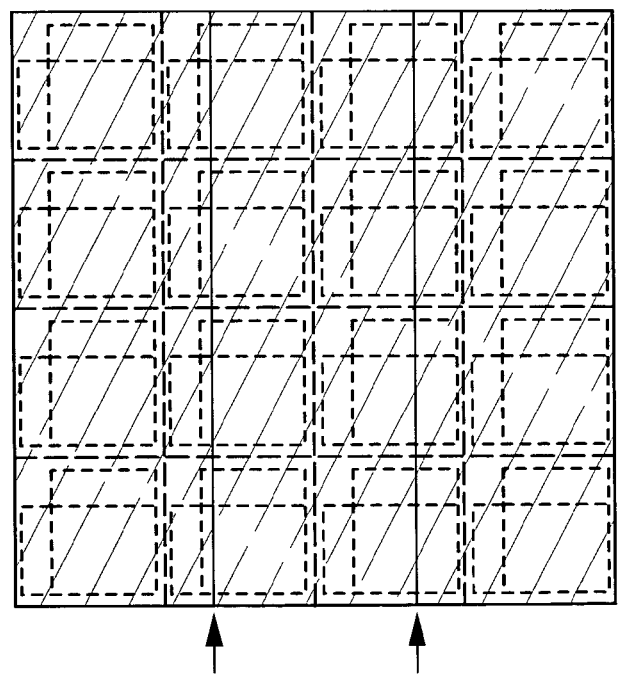
Figure 7A:
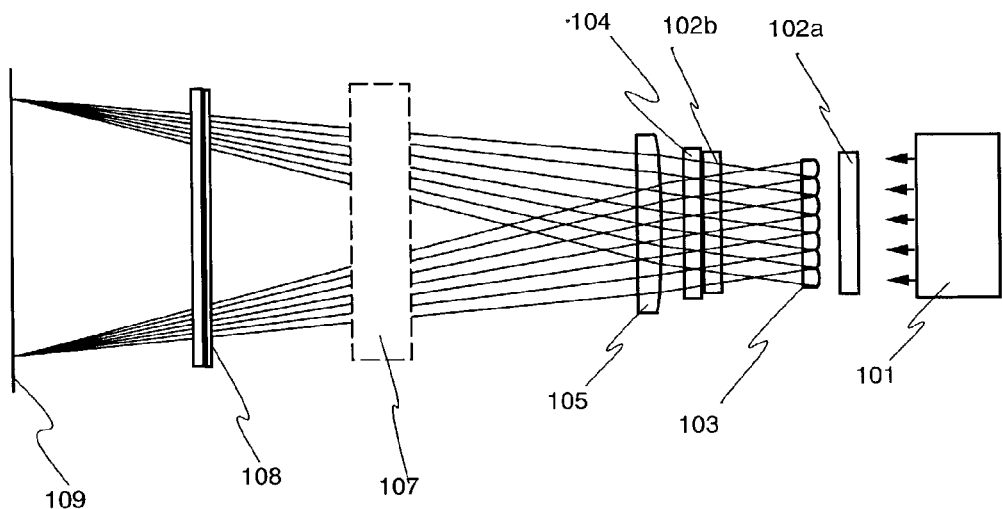
FIGS. 7A and 7B are a top view and a cross sectional view of an example of a conventional optical system.
Figure 7B:
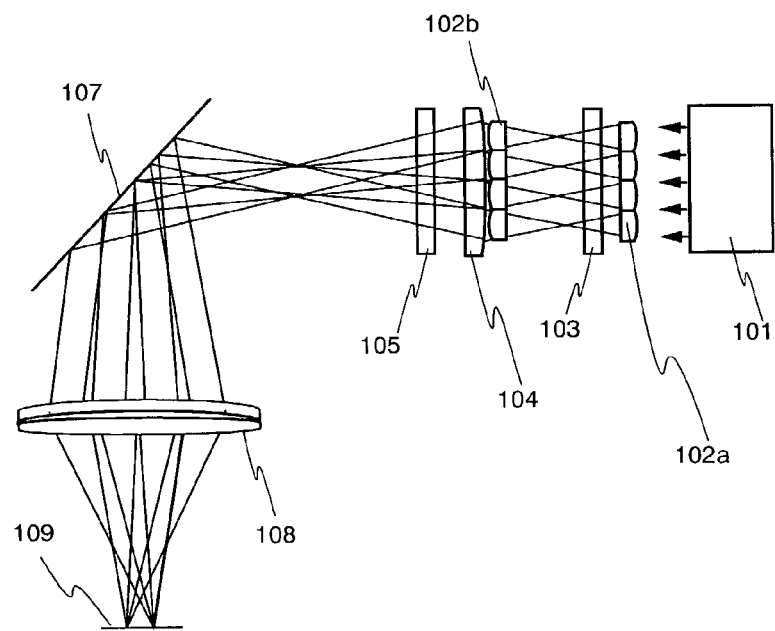
Figure 8A:
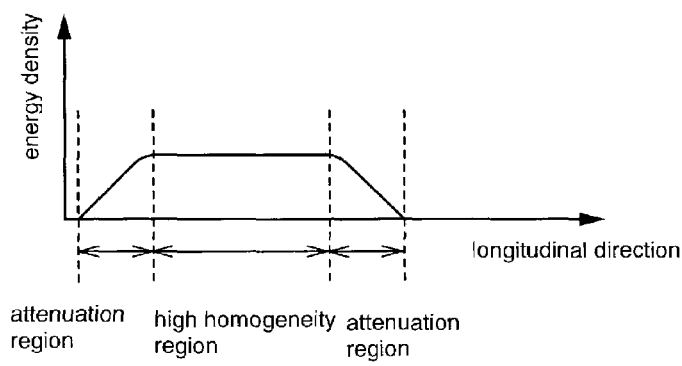
FIG. 8A shows an example of an energy density distribution of laser light produced by the conventional optical system and FIG. 8B shows an example in which a large area substrate is annealed using the laser light shown in FIG. 8A.
Figure 8B:
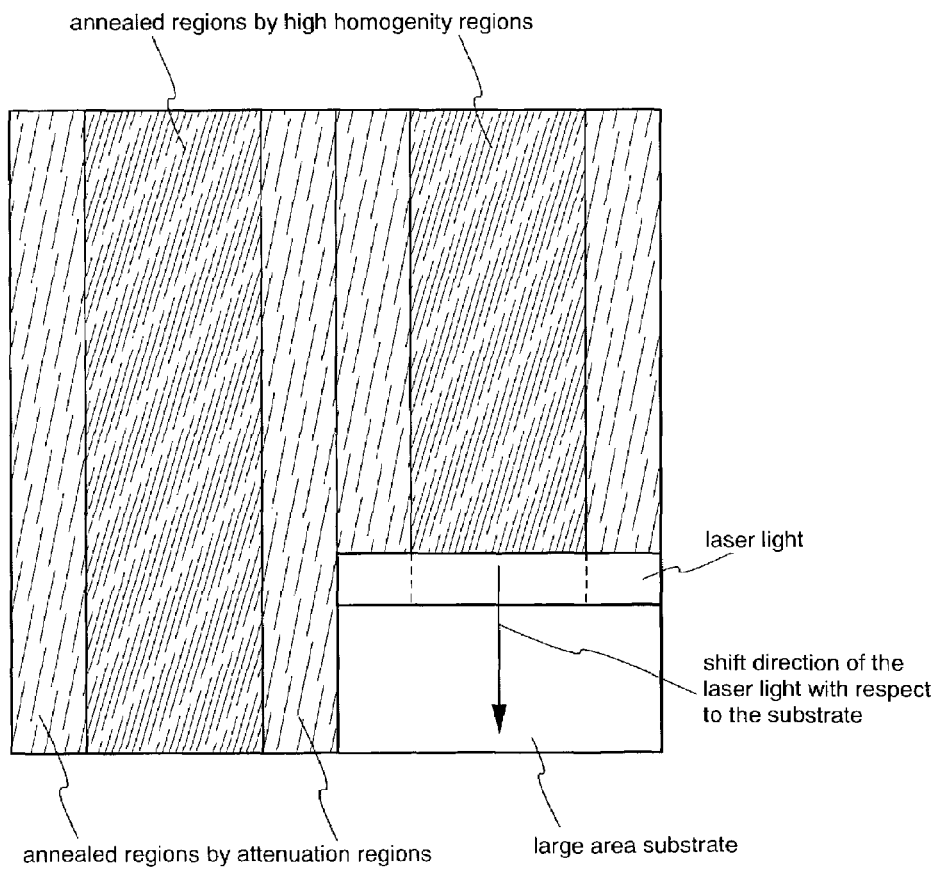
Figure 9A:
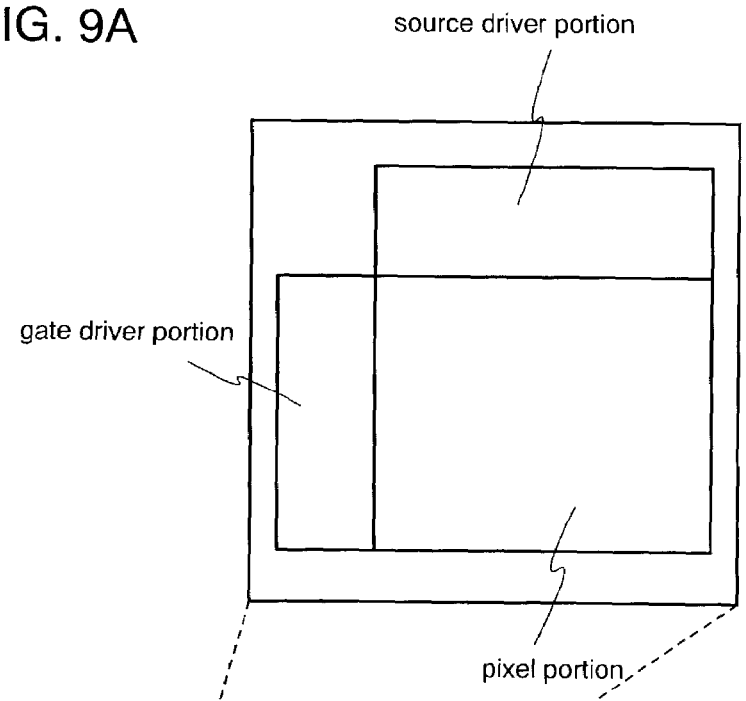
FIG. 9A and 9B show an example of a large area substrate.
Figure 9B:
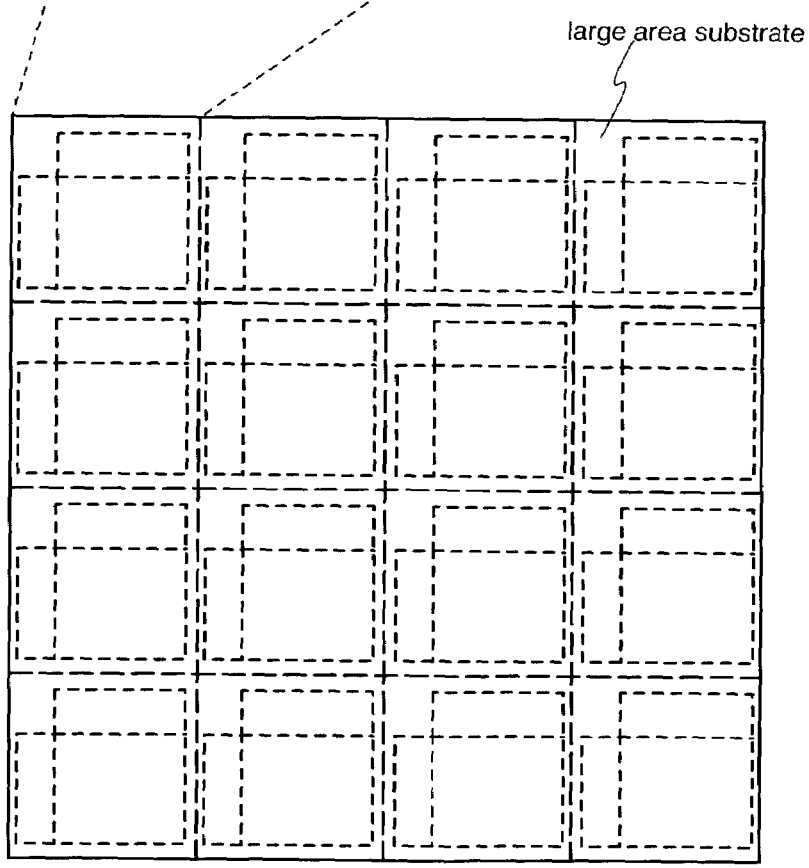

In this embodiment, the case where laser annealing is conducted for a large area substrate will be described using FIGS. 6A and 6B.

First, laser light having high homogeneity of an energy density is produced in accordance with any one of Embodiments 1 to 3. Then, the laser light is irradiated to the large area substrate while relatively shifted (FIG. 6A). At this time, a length of the laser light in a longitudinal direction is shorter than one side of the large area substrate, so that entire annealing cannot be conducted by only scanning in one direction. Thus, it is required that scanning is conducted plural times while laser light is moved in at least two directions, thereby forming regions in which the scannings using laser light are adjacent to each other as shown in FIG. 6B. However, laser light produced by the present invention has a steep energy density distribution in end portions, so that attenuation regions are not generated. Therefore, uniform annealing can be also realized for the regions in which the scannings using laser light are adjacent to each other. As a result, the large area substrate can be utilized without waste, thereby markedly improving throughput.

Embodiment 5

A method of manufacturing an active matrix substrate is explained in this embodiment using FIGS. 10A to 13. A substrate on which a CMOS circuit, a driver circuit, and a pixel portion having a TFT pixel and a storage capacitor are formed together is called active matrix substrate for convenience.

First, a substrate 400 made from glass such as barium borosilicate glass or aluminum borosilicate glass is used in this embodiment. Note that substrates such as a quartz substrate, a silicon substrate, a metal substrate, and a stainless substrate having an insulating film formed on the substrate surface may also be used as the substrate 400. Further, a plastic substrate having heat resisting properties capable of enduring the processing temperatures used in this embodiment may also be used. Because this invention can anneal by using the laser light with a very excellent uniformity of the energy distribution, the large area substrate can be used.

Next, a base film 401 made from an insulating film such as a silicon oxide film, a silicon nitride film, or a silicon oxynitride film is then formed on the substrate 400 by the known method. A two layer structure (401*a* and 401*b*) is used as the base film 401 in this embodiment, but a single layer of the above-mentioned insulating film may also be used, and a structure in which more than two layers are laminated may also be used.

Next, semiconductor layers 402 to 406 are formed on the base film. First of all, semiconductor film is formed 25 to 80 nm thick (preferably 30 to 60 nm) by a known method (such as the sputtering method, the LPCVD method, the plasma CVD method and the like). Then, the semiconductor film is crystallized by a laser crystallization method. The laser crystallization method is that the laser light shot from the laser is applied to the semiconductor film by applying one of Embodiments 1 to 4. Of course, not only the laser crystallization method but also any other known crystallization method (RTA, the thermal crystallization method using a furnace annealing, the thermal crystallization method using metal elements which promote crystallization) may also be combined. Patterning is performed on the obtained crystalline semiconductor film in a desired form in order to form the semiconductor layers 402 to 406. The semiconductor film may be an amorphous semiconductor film, a micro crystal semiconductor film or a crystalline semiconductor film. Alternatively, the semiconductor film may be a compound semiconductor film having an amorphous structure such as an amorphous silicon germanium film.

In this embodiment, plasma CVD method is used to form an amorphous silicon film 55 nm thick. After the dehydrogenation is performed on this amorphous silicon film (at 500° C. for one hour), the laser light shot from a continuous oscillation YVO₄ laser with output 10 W is converted into the second higher harmonic wave by a nonlinear, optical element and then the laser light is formed and irradiated from one of the optical system shown in Embodiment 1 to Embodiment 3. At this time, about 0.01 to 100 MW/cm² (preferably 0.1 to 10 MW/cm²) is necessary for the energy density. It is preferable to assume the pulse oscillation frequency 300 Hz when the excimer laser is used, and to assume the laser energy density to be 100 to 1000 mJ/cm² (typically 200 to 700 mJ/cm²). The stage is relatively moved to the laser light at a speed of about 0.5 to 2000 cm/s, and it irradiates, and then the crystalline silicon film is formed. The semiconductor layers 402 to 406 are formed by performing a patterning process thereon by using a photolithography method.

Doping of a very small amount of an impurity element (boron or phosphorus) may be performed after forming the semiconductor films 402 to 406 in order to control a TFT threshold.

A gate insulating film 407 is formed next, covering the semiconductor films 402 to 406. The gate insulating film 407 is formed by an insulating film containing silicon with a thickness of 40 to 150 nm using plasma CVD or sputtering. In this embodiment, a silicon oxynitride film having a film thickness of 110 nm (composition ratios: Si=32%; O=59%; N=7%; H=2%) is formed by plasma CVD. The gate insulating film is of course not limited to a silicon oxynitride film, but other insulating films containing silicon may be used in a single layer or in a lamination structure.

Further, if a silicon oxide film is used, it can be formed by plasma CVD with a mixture of TEOS (Tetraethyl Orthosilicate) and O₂, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD using tungsten hexafluoride (WF₆). Whichever is used, it is necessary to be able to make the film become low resistance in order to use it as a gate electrode, and it is preferable that the resistivity of the W film be made less than 20 μΩcm.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorus is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 10B). An ICP (Inductively Coupled Plasma) etching method is used in this embodiment as a first etching condition. A gas mixture of CF₄, Cl₂, and O₂ is used as an etching gas, the gas flow rates are set to 25:25:10 (sccm), respectively, a plasma is generated by applying a 500 W RF (13.56 MHz) electric power to a coil shape electrode at a pressure of 1 Pa, and etching is performed. A 150 W RF (13.56 MHz) electric power is also applied to the substrate side (sample stage), thereby effectively applying a negative self-bias voltage. The W film is etched under the first etching conditions, and the edge portion of the first conductive film is made into a tapered shape.

The etching conditions are changed to a second etching condition without removing the resist masks 410 to 415. A gas mixture of CF₄ and Cl₂ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also applied to the substrate side (sample stage), thereby effectively applying a negative self-bias voltage. The W film and the TaN film are both etched as the same order by the second etching conditions using the gas mixture of CF₄ and Cl₂. Note that the etching time may be increased in the order of 10 to 20% in order to perform etching such that no residue remains on the gate insulating film.

Edge portions of the first conductive film and the second conductive film are made into a tapered shape in accordance with the effect of a bias voltage, applied to the substrate side, by making the shapes of the resist masks suitable with the above-mentioned first etching condition. The angle of the tapered portions is from 15 to 45°. First shape conductive films 417 to 422 (first conductive films 417*a* to 422*a*, and second conductive films 417*b* to 422*b*) are thus formed from the first conductive films and the second conductive films by the first etching process. Reference numeral 416 denotes a gate insulating film, and regions not covered by the first shape conductive films 417 to 422 become thinner by approximately 20 to 50 nm through etching.

A second etching process is then performed without removing the resist masks (FIG. 10C). Here, W film is selectively etched by using CF₄, Cl₂, and O₂ for the etching gas. At this time, the second conductive layers 428*b* to 433*b* are formed by the second etching process. On the other hand, the first conductive layers 417*a* to 422*a* are hardly etched and the second shape conductive layers 428 to 433 are formed.

A first doping process is then performed without removing the resist masks and the semiconductor layer is added to the impurity element which imparts n-type at a low concentration. The doping process may be performed by ion doping or ion implantation. Ion doping is performed with process conditions in which the dosage is set from $1\times10^{13}$ to $5\times10^{14}$/cm², and the acceleration voltage is set between 40 and 80 keV. Doping is performed in this embodiment with the dosage set to $1.5\times10^{13}$/cm², and the acceleration voltage set to 60 keV. An element belonging to the group 15, typically phosphorus (P) or arsenic (As) is used as an impurity element which imparts n-type. Phosphorus (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}/\text{cm}^3$.

Next, after removing the resist masks, new resist masks 434a to 434c are formed, and the second doping process is performed in higher acceleration voltage than the first doping process. Ion doping is performed with process conditions in which the dosage is set from $1\times10^{13}$ to $1\times10^{15}/\text{cm}^2$, and the acceleration voltage is set between 60 and 120 keV. The doping process is performed by using the second conductive layers 428b to 432b as masks and the semiconductor layer under the taper part of the first conductive layer is added to the impurity element. Continuously the acceleration voltage is lowered than the second doping process, the third doping process is done, and the state of FIG. 11A is obtained. Ion doping is performed with process conditions in which the dosage is set from $1\times10^{15}$ to $1\times10^{17}/\text{cm}^2$, and the acceleration voltage is set between 50 to 100 keV. Low concentration impurity regions 436, 442 and 448 which come in succession as for the first conductive layer are added to the impurity element, which imparts n-type within the range of the density of $1\times10^{18}$ to $5\times10^{19}/\text{cm}^2$ by the second doping process and the third doping process and high concentration impurity regions 435, 441, 444 and 447 are added to the impurity element, which imparts n-type within the range of the density of $1\times10^{19}$ to $5\times10^{21}/\text{cm}^2$.

Of course, the second doping process and the third doping process can be one-time doping processes by making it to a suitable acceleration voltage and it is also possible to form the low concentration impurity region and high concentration impurity region.

Next, after removing the resist masks, new masks 450a to 450c made from resist are formed and the fourth doping process is performed. Impurity regions 453, 454, 459 and 460, to which an impurity element which imparts a conductivity type opposite to that of the above single conductivity type is added, are formed in accordance with the fourth doping process in the semiconductor films which become active layers of the p-channel TFTs. The second conductive layers 428a to 432a are used as masks with respect to the impurity element, and an impurity element which imparts p-type conductivity is added to form the impurity regions in a self-aligning manner. The impurity regions 453, 454, 459 and 460 are formed by ion doping using diborane ($B_2H_6$) in this embodiment (see FIG. 11B). The semiconductor layers for forming the n-channel TFT are covered with the resist masks 450a to 450c when the fourth doping process is performed. Phosphorus is added at different concentrations into the impurity regions 439, 447 and 448 by the first doping process and by the third doping process. However, by performing doping such that the concentration of the impurity element which imparts p-type conductivity becomes from $1\times10^{19}$ to $5\times10^{21}$ atoms/$\text{cm}^3$ in each of the regions, no problems develop in making the regions function as source regions and drain regions of the p-channel TFT.

The impurity regions are thus formed in the respective semiconductor layers by the steps up through this point.

A first interlayer insulating film 461 is formed next after removing the resist masks 450a to 450c. This first interlayer insulating film 461 is formed from an insulating film containing silicon, having a thickness of 100 to 200 nm, by using plasma CVD or sputtering. A silicon oxynitride film having a thickness of 150 nm is formed by plasma CVD in this embodiment. The first interlayer insulating film 461 is of course not limited to a silicon oxynitride film, and other insulating films containing silicon may also be used, as a single layer or a lamination structure.

Recovery of the crystallinity of the semiconductor layer and an activation of the impurity elements added to the respective semiconductor layers are performed by irradiating the laser light, as shown in FIG. 11C. At this time, energy density of the laser light is necessary about 0.01 to 100 MW/$\text{cm}^2$ (Preferably 0.01 to 10 MW/$\text{cm}^2$), and moves the substrate to the laser light relatively at the speed of 0.5 to 2000 MW/$\text{cm}^2$. Besides, laser annealing method, thermal annealing method or rapid thermal annealing method (RTA method) and the like can be applied.

Further, a heat treatment process may also be performed before the formation of a first interlayer insulating film. However, if the wiring material used is weak with respect to heat, then it is preferable to perform a heat treatment process after forming an interlayer insulating film (an insulating film having silicon as its main constituent, for example a silicon nitride film) in order to protect the wirings and the like, as in this embodiment.

Then, a heat treatment process for hydrogenation can also be performed (for 1 to 12 hours at 300 to 550° C.). This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment process for 1 to 12 hours at a temperature of 300 to 450° C. in an atmosphere containing hydrogen of from 3 to 100% may also be performed as other means of hydrogenation.

A second interlayer insulating film 462 made from an inorganic insulating film material or from an organic insulating film material is formed next on the first interlayer insulating film 461. An acrylic resin film having a film thickness of 1.6 µm is formed in this embodiment, and the material used may have a viscosity from 10 to 1000 cp, preferably between 40 to 200 cp. A material in which unevenness is formed on its surface is used.

In order to prevent specular reflection, the surface of a pixel electrode is made uneven by forming a second interlayer insulating film which forms an uneven surface in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent specular reflection, and thereby increasing whiteness by scattering reflected light.

Figure 12:
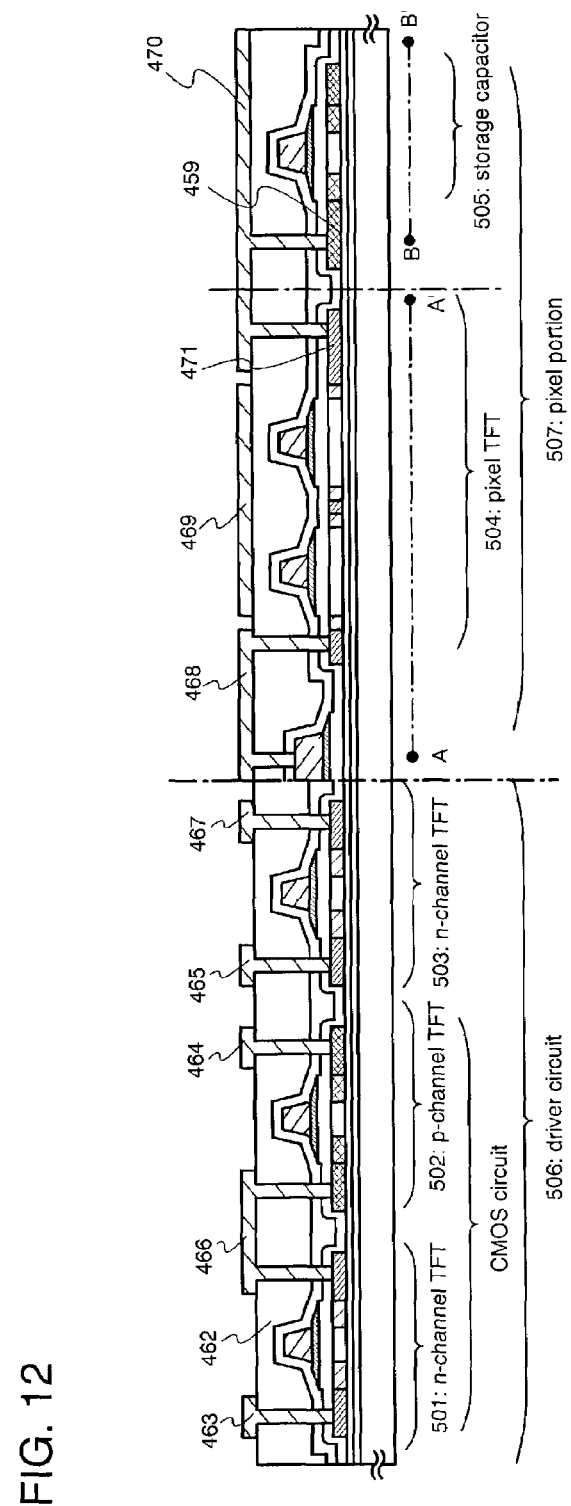
FIG. 12 is a sectional view showing steps of manufacturing the pixel TFTs and the driver circuit TFTs.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, two layer structure is not limited, and the single-layer structure or the lamination structure more than three layers are also acceptable. Further, Al and Ti are not limited to the wiring material. For example, Al and Cu are formed on TaN film, and the lamination film forming the Ti film is formed by the patterning and form wiring (FIG. 12).

Furthermore, a pixel electrode 470, a gate wiring 469, and a connection electrode 468 are formed in a pixel portion 507. An electrical connection is formed with the pixel TFT and the source wiring (lamination of 433*a* and 433*b*) by the connection electrode 468. Further, the gate wiring 469 forms an electrical connection with the gate electrode of the pixel TFT. The pixel electrode 470 forms an electrical connection with the drain region 471 of the pixel TFT, and in addition, forms an electrical connection with the semiconductor layer 459 which functions as one electrode forming a storage capacitor. It is preferable to use a material having superior reflectivity, such as a film having Al or Ag as its main constituent, or a lamination film of such films, as the pixel electrode 470.

A CMOS circuit composed of a n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428*a* that structures a portion of the gate electrode; and the high concentration impurity region 452 which functions as a source region or a drain region. The p-channel TFT 502, which forms the CMOS circuit with the n-channel TFT 501 and the electrode 466 by an electrical connection has: a channel forming region 440; the low concentration impurity region 454 (GOLD region) which overlaps with the first conductive layer 429*a* that structures a portion of the gate electrode; and the high concentration impurity region 453 which functions as a source region or a drain region. Further, the n-channel TFT 503 has: a channel forming region 443; the low concentration impurity region 442 (GOLD region) which overlaps with the first conductive layer 430*a* that structures a portion of the gate electrode; and the high concentration impurity region 456 which functions as a source region or a drain region.

The pixel TFT 504 of the pixel portion has: a channel forming region 446; the low concentration impurity region 445 (LDD region) formed on the outside of the gate electrode; and the high concentration impurity region 458 which functions as a source region or a drain region. Further, an impurity element which imparts n-type and an impurity element which imparts p-type are added to the semiconductor layer which functions as one electrode of the storage capacitor. The storage capacitor 505 comprises an electrode (lamination of 432*a* and 432*b*) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 13:
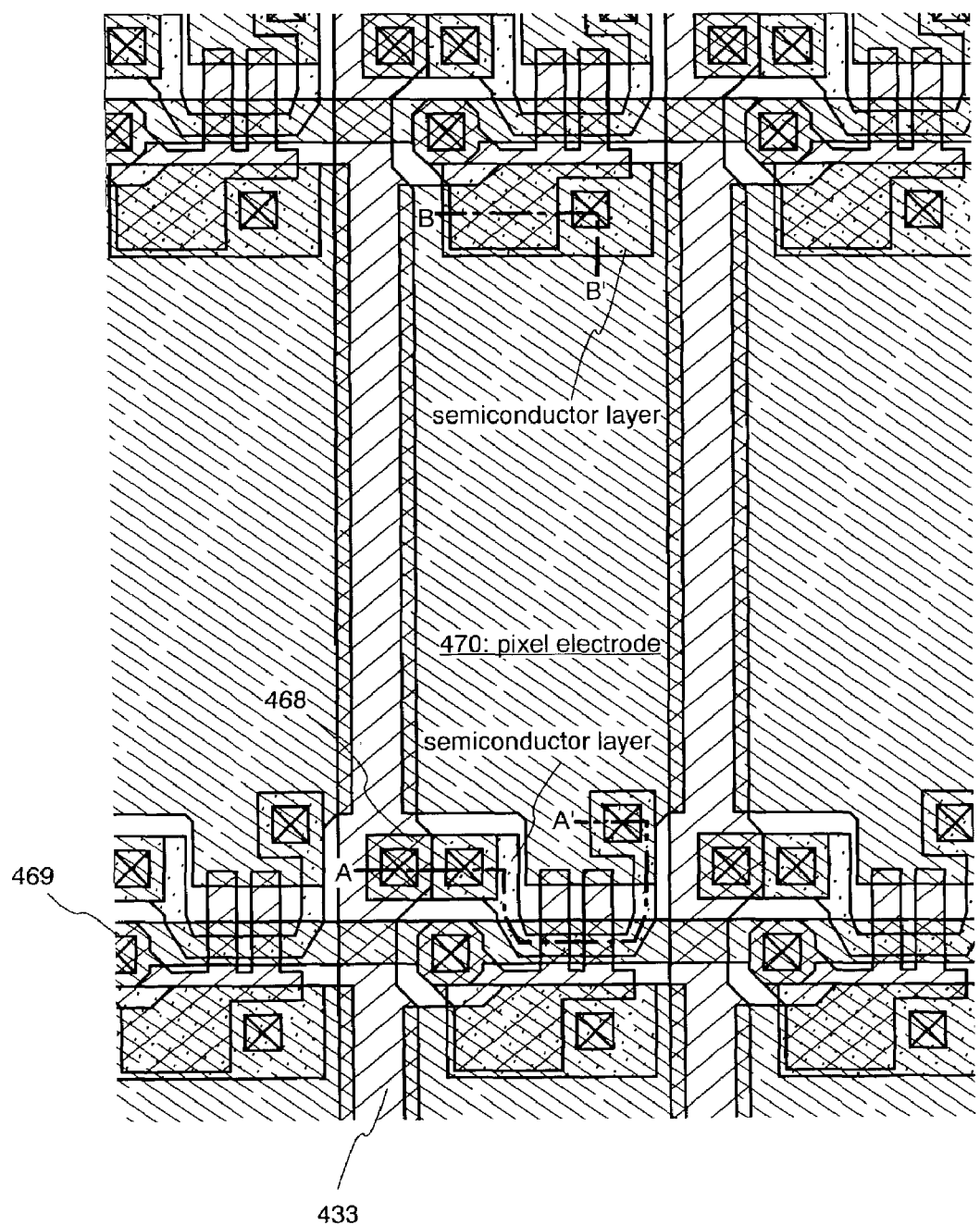
FIG. 13 is a top view showing a structure of the pixel TFT.

An upper surface diagram of the pixel portion of the active matrix substrate manufactured by this embodiment is shown in FIG. 13. Note that the same reference symbols are used for portions corresponding to those in FIGS. 10A to 13. A chain line A–A' in FIG. 12 corresponds to a cross sectional diagram cut along a chain line A–A' within FIG. 13. Further, a chain line B–B' in FIG. 12 corresponds to a cross sectional diagram cut along a chain line B–B' within FIG. 13.

Embodiment 6

Figure 14:
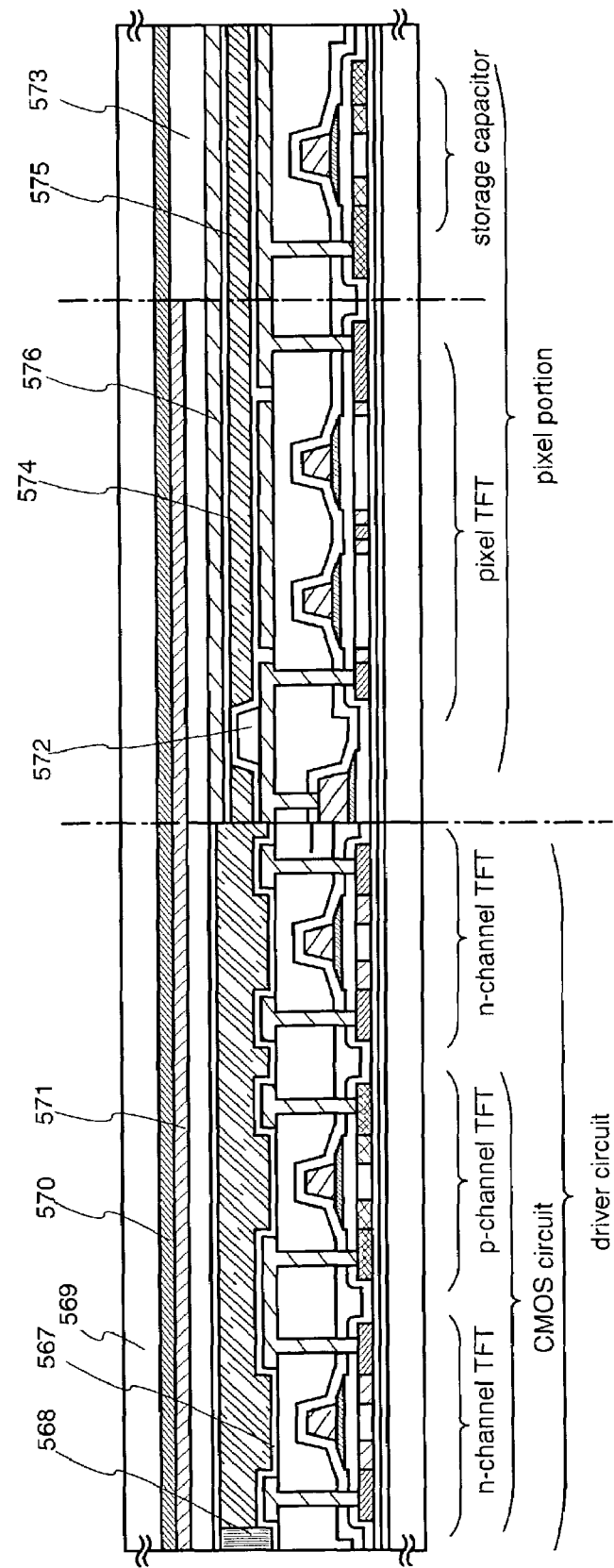
FIG. 14 is a sectional view of an active matrix liquid crystal display device.

A process of manufacturing a reflection type liquid crystal display device from the active matrix substrate manufactured in Embodiment 5 is explained below in this embodiment. FIG. 14 is used in the explanation.

An active matrix substrate in the state of FIG. 12 is first obtained in accordance with Embodiment 5, an alignment film 567 is then formed on at least the pixel electrode 470 on the active matrix substrate of FIG. 12, and a rubbing process is performed. Note that, before forming the alignment film 567 in this embodiment, columnar spacer 572 is formed in desired positions by patterning an organic resin film, such as an acrylic resin film and the like, in order to maintain a gap between substrates. Further, spherical shape spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 5 is used in this embodiment. Therefore, with the top surface diagram of the pixel portion of Embodiment 5 shown in FIG. 13, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an alignment film 574 is formed over the entire surface of the opposing substrate, and a rubbing process is performed.

The active matrix substrate on which the pixel portion and the driver circuit are formed, and the opposing substrate are then joined by a sealing material 568. A filler is mixed in the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 14 is thus completed. The active matrix substrate or the opposing substrate is then cut into a desired shape if necessary. In addition, a polarizing plate (not shown in the figure) is attached to only the opposing substrate. An FPC is then attached using a known technique.

Liquid crystal display device made by above-mentioned method has TFT by using the semiconductor film thoroughly annealed because the laser light with a very excellent uniformity of the energy distribution is irradiated. It is possible to become the one with enough operation characteristic and reliability of the above-mentioned liquid crystal display device. Such a liquid crystal display can be used as a display portion in various types of electronic equipment.

Note that it is possible to freely combine this embodiment with Embodiments 1 to 5.

Embodiment 7

In this embodiment, an example of manufacturing the light emitting device by using a manufacturing method of TFT that is used for forming an active matrix substrate. In this specification, the light-emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a luminous body), an anode, and a cathode. Meanwhile, the electroluminescence in compound includes the light emission (fluorescent light) upon returning from the singlet-excited state to the ground state and the light emission (phosphorescent light) upon returning from the triplet-excited state to the ground state, including any or both of light emission.

In this specification, all layers formed between the anode and the cathode in the luminescence element are defined as the luminous body. The luminescence layer, the hole injection layer, the electronic injection layer, the hole transportation layer, and the electronic transportation layer, etc. are concretely included in the luminous body. The luminescence element basically has the structure that the anode layer, the luminescence layer, and the cathode layer are sequentially laminated. The structures laminated in order of the anode layer, the hole injection layer, the luminescence layer, the cathode layer, the anode layer, the hole injection layer, the luminescence layer, the electronic transportation layer, and the cathode layer, etc. in addition to this structure are occasionally possessed.

Figure 15:
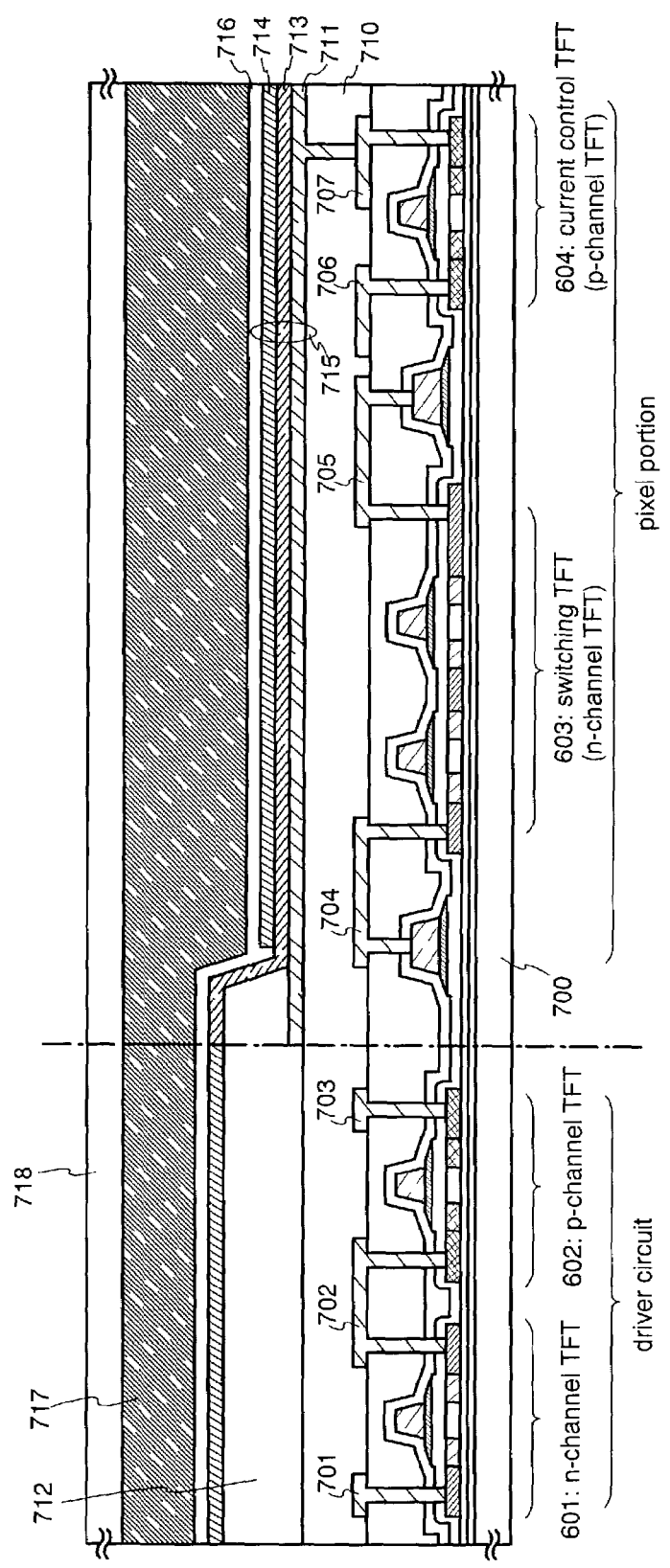
FIG. 15 is a sectional structure view showing a driver circuit and a pixel portion of a light emitting device.

FIG. 15 is a sectional view of a light-emitting device of this embodiment. In FIG. 15, the switching TFT 603 provided on the substrate 700 is formed by using the n-channel TFT 503 of FIG. 15. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 12. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring and the drain region of the switching TFT.

Incidentally, a current control TFT 604 is formed by using the p-channel TFT 502 of FIG. 12. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT 604 (corresponding to a current supply line) while the wiring 707 is an electrode to be electrically connected to the pixel electrode 711 by being overlaid a pixel electrode 711 of the current control TFT.

Meanwhile, 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 15. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A luminous body 713 is formed on the pixel electrode 711. Incidentally, although FIG. 15 shows only one pixel, this embodiment separately forms the luminous body correspondingly to the respective colors of R (red), G (green) and B (blue). Meanwhile, in this embodiment is formed a low molecular weight organic electroluminescent material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a phosphor and not necessarily limited to this. It is satisfactory to form a luminous body (layer for light emission and carrier movement therefore) by freely combining a light-emitting layer, a charge transporting layer and an electron injecting layer. For example, although in this embodiment was shown the example in which a low molecular weight organic electroluminescent material is used for a light-emitting layer, it is possible to use an intermediate organic electroluminescent material and a high molecular weight organic electroluminescent material. In this specification, an intermediate molecular weight organic material can be defined that an aggregate of an organic electroluminescent material which does not have subliming property or dissolving property (preferably, an aggregate which has molecularity of 20 or less), or an organic electroluminescent material (referred to as intermediate molecular weight organic electroluminescent material) which has a molecular chain length of 10 μm or less (preferably 50 nm or less). For an example of using the high molecular weight organic electroluminescent material, a polythiophene (PEDOT) film of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π conjugated high molecular of PPV. Meanwhile, it is possible to use an inorganic material such as silicon carbide for an electron transporting layer or charge injecting layer. These organic electroluminescent materials or inorganic materials can be a known material.

Next, a cathode 714 of a conductive film is provided on the luminous body 713. In this embodiment, as the conductive film is used an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 15. Incidentally, it is effective to continuously carry out, without releasing to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFT 601, p-channel TFT 602, a switching TFT (n-channel TFT) 603 and a current control TFT (n-channel TFT) 604 are formed on the substrate 700.

Furthermore, as explained using FIG. 15, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

The light emitting device formed by the above-mentioned method has TFT formed by using the semiconductor film thoroughly annealed, because it is irradiated the laser light that has a very excellent uniform energy distribution. Therefore, the above-mentioned light-emitting device is obtained enough operation characteristic and reliability. Such a light emitting device can be used as display parts of various electronic equipments.

This embodiment can be freely combined with Embodiments 1 to 5.

Embodiment 8

Various semiconductor devices (active matrix type liquid crystal display device, active matrix type light-emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, or a mobile information terminal (such as a mobile computer, a mobile telephone or an electronic book). FIGS. 16, 17 and 18 show one of its examples.

FIG. 16A shows a personal computer which includes a main body 3001, an image input portion 3002, a display portion 3003, a keyboard 3004 and the like. The invention can be applied to the display portion 3003.

FIG. 16B shows a video camera which includes a main body 3101, a display portion 3102, a sound input portion 3103, operating switches 3104, a battery 3105, an image receiving portion 3106 and the like. The invention can be applied to the display portion 3102.

FIG. 16C shows a mobile computer which includes a main body 3201, a camera portion 3202, an image receiving portion 3203, an operating switch 3204, a display portion 3205 and the like. The invention can be applied to the display portion 3205.

FIG. 16D shows a goggle type display which includes a main body 3301, a display portion 3302, arm portions 3303 and the like. The invention can be applied to the display portion 3302.

FIG. 16E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The invention can be applied to the display portion 3402.

FIG. 16F shows a digital camera which includes a body 3501, a display portion 3502, an eyepiece portion 3503, operating switches 3504, an image receiving portion (not shown) and the like. The invention can be applied to the display portion 3502.

FIG. 17A shows a front type projector which includes a projection device 3601, a screen 3602 and the like. The invention can be applied to a liquid crystal display device 3808 which constitutes a part of the projection device 3601 as well as other driver circuits.

FIG. 17B shows a rear type projector which includes a main body 3701, a projection device 3702, a mirror 3703, a screen 3704 and the like. The invention can be applied to the liquid crystal display device 3808 which constitutes a part of the projection device 3702 as well as other driver circuits.

FIG. 17C shows one example of the structure of each of the projection devices 3601 and 3702 which are respectively shown in FIGS. 17A and 17B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Embodiment 8 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 17C.

FIG. 17D is a view showing one example of the structure of the light source optical system 3801 shown in FIG. 17C. In Embodiment 8, the light source optical system 3801 is made of a reflector 3811, a light source 3812, lens arrays 3813 and 3814, a polarizing conversion element 3815 and a condenser lens 3816. Incidentally, the light source optical system shown in FIG. 17D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 17A to 17D is of the type using a transparent type of electro-optical device, but there is not shown an example in which the invention is applied to a reflection type of electro-optical device and a light-emitting device.

Figure 18A:
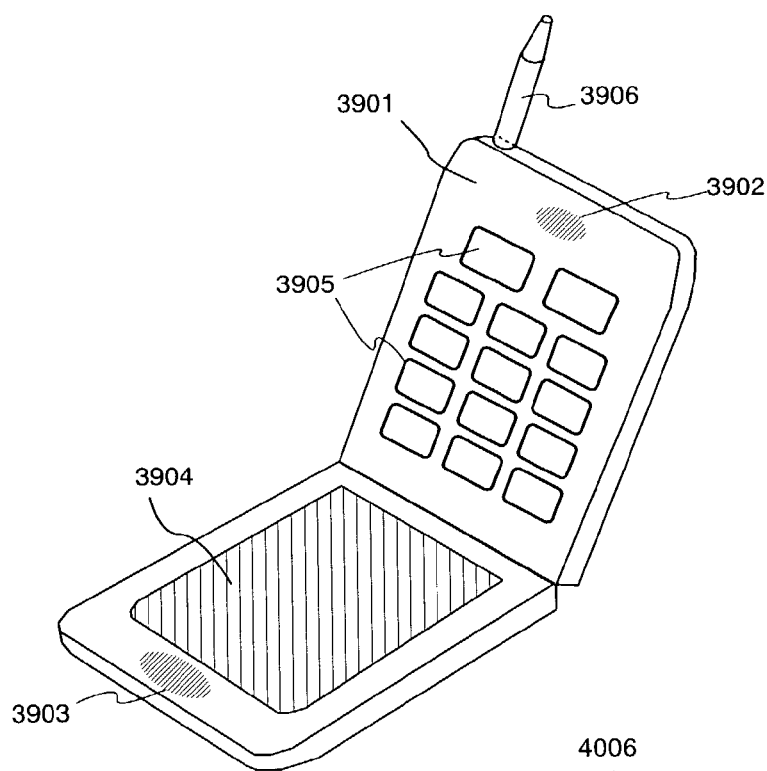
FIGS. 18A to 18C show examples of semiconductor devices.

FIG. 18A shows a portable telephone which includes a main body 3901, a sound output portion 3902, a sound input portion 3903, a display portion 3904, operating switches 3905, an antenna 3906 and the like. The invention can be applied to the display portion 3904.

Figure 18B:
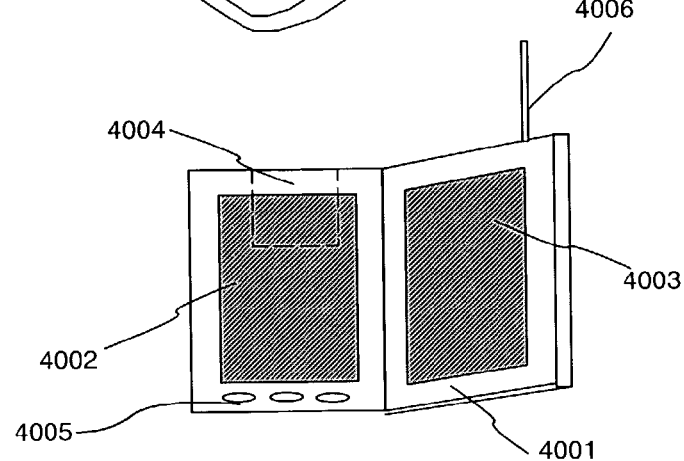

FIG. 18B shows a portable book (electronic book) which includes a main body 4001, display portions 4002 and 4003, a storage medium 4004, operating switches 4005, an antenna 4006 and the like. The invention can be applied to the display portions 4002 and 4003.

Figure 18C:
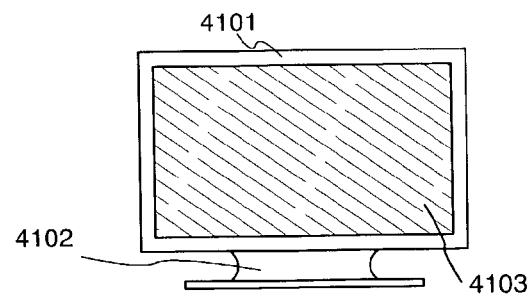

FIG. 18C shows a display which includes a main body 4101, a support base 4102, a display portion 4103 and the like. The invention can be applied to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 6 and 7.

When the constitution of the present invention is employed, the following fundamental significance can be obtained.

(a) Laser light having a very superior energy density distribution can be produced on a surface to be irradiated or a surface of its vicinity.

(b) Uniform annealing can be conducted for an object to be irradiated. This is particularly effective in the case of a large area substrate.

(c) Throughput can be improved.

(d) When the above advantages are satisfied, improvements of an operating characteristic and reliability of a semiconductor device represented by an active matrix liquid crystal display device can be realized. Further, a reduction in a manufacturing cost of a semiconductor device can be realized.

What is claimed is:

1. A method of manufacturing a semiconductor device comprising:
    converting a first energy density distribution of a laser light emitted from a laser into a second energy density distribution by a means, wherein the second energy density has an attenuation region;
    homogenizing an energy density in an end portion of the laser light having the second energy density distribution by providing a mirror in the attenuation region; and
    irradiating a surface to be irradiated with the laser light having the homogenized energy density while relatively shifting the surface to be irradiated.

2. A method of manufacturing a semiconductor device comprising:
    changing a sectional shape of a laser light emitted from a laser into a first shape by a means, wherein the first shape has an elongated cross section;
    homogenizing an energy density distribution in an end portion of the elongated cross section of the laser light by a mirror; and
    irradiating a surface to be irradiated with the laser light having the homogenized energy density while relatively shifting the surface to be irradiated.

3. A method of manufacturing a semiconductor device according to any one of claim 1 or 2, wherein the means comprises a homogenizer located to be orthogonal to an optical axis of the laser light.

4. A method of manufacturing a semiconductor device according to any one of claim 1 or 2, wherein the means comprises a plurality of cylindrical lens arrays which are arranged in parallel so as to be orthogonal to an optical axis of the laser light and divide the laser light in the arrangement directions.

5. A method of manufacturing a semiconductor device according to any one of claim 1 or 2, wherein the means comprises a plurality of cylindrical lens groups and a lens, wherein the cylindrical lens groups are arranged in parallel so as to be orthogonal to an optical axis of the laser light and divide the laser light in the arrangement directions, and wherein the lens is located in a transmission side of the cylindrical lens groups and synthesizes the divided laser lights.

6. A method of manufacturing a semiconductor device according to any one of claim 1 or 2, wherein the means comprises a fly eye lens which is located to be orthogonal to an optical axis of the laser light and divides the laser light.

7. A method of manufacturing a semiconductor device according to any one of claim 1 or 2, wherein the means comprises a fly eye lens and a spherical lens, wherein the fly eye lens is located to be orthogonal to an optical axis of the laser light and divides the laser light, and wherein the spherical lens is located in a transmission side of the fly eye lens and synthesizes the divided laser lights.

8. A method of manufacturing a semiconductor device according to any one of claim 1 or 2, wherein the end portion of the laser light is a region parallel to a shift direction of the laser light.

9. A method of manufacturing a semiconductor device according to any one of claim 1 or 2, wherein the laser comprises at least one selected from the group consisting of a continuous oscillation solid laser, a continuous oscillation gas laser, a pulse oscillation solid laser, and a pulse oscillation gas laser.

10. A method of manufacturing a semiconductor device according to any one of claim 1 or 2, wherein the laser comprises at least one selected from the group consisting of a YAG laser, a $YVO_4$ laser, a YLF laser, a $YAlO_3$ laser, a glass laser, a ruby laser, an alexandrite laser, and a Ti: sapphire laser.

11. A method of manufacturing a semiconductor device according to any one of claim 1 or 2, wherein the laser is one selected from the group consisting of an excimer laser, an Ar laser, and a Kr laser.

12. A method of manufacturing a semiconductor device according to any one of claim 1 or 2, wherein the semiconductor device is at least one selected from the group consisting of a personal computer, a video camera, a mobile computer, a goggle type display, a player using a recording medium, a digital camera, a projector, a portable telephone, and an electronic book.

13. A method of manufacturing a semiconductor device comprising:
   forming a semiconductor film over a substrate;
   converting a first energy density distribution of a laser light emitted from a laser into a second energy density distribution by a means, wherein the second energy density has an attenuation region;
   homogenizing an energy density in an end portion of the laser light having the second energy density distribution by providing a mirror in the attenuation region; and
   irradiating the semiconductor film with the laser light having the homogenized energy density while relatively shifting the semiconductor film.

14. A method of manufacturing a semiconductor device according to claim 13, wherein the means comprises a homogenizer located to be orthogonal to an optical axis of the laser light.

15. A method of manufacturing a semiconductor device according to claim 13, wherein the means comprises a plurality of cylindrical lens arrays which are arranged in parallel so as to be orthogonal to an optical axis of the laser light and divide the laser light in the arrangement directions.

16. A method of manufacturing a semiconductor device according to claim 13, wherein the means comprises a plurality of cylindrical lens groups and a lens, wherein the cylindrical lens groups are arranged in parallel so as to be orthogonal to an optical axis of the laser light and divide the laser light in the arrangement directions, and wherein the lens is located in a transmission side of the cylindrical lens groups and synthesizes the divided laser lights.

17. A method of manufacturing a semiconductor device according to claim 13, wherein the means comprises a fly eye lens which is located to be orthogonal to an optical axis of the laser light and divides the laser light.

18. A method of manufacturing a semiconductor device according to claim 13, wherein the means comprises a fly eye lens and a spherical lens, wherein the fly eye lens is located to be orthogonal to an optical axis of the laser light and divides the laser light, and wherein the spherical lens is located in a transmission side of the fly eye lens and synthesizes the divided laser lights.

19. A method of manufacturing a semiconductor device according to claim 13, wherein the end portion of the laser light is a region parallel to a shift direction of the laser light.

20. A method of manufacturing a semiconductor device according to claim 13, wherein the laser comprises at least one selected from the group consisting of a continuous oscillation solid laser, a continuous oscillation gas laser, a pulse oscillation solid laser, and a pulse oscillation gas laser.

21. A method of manufacturing a semiconductor device according to claim 13, wherein the laser comprises at least one selected from the group consisting of a YAG laser, a $YVO_4$ laser, a YLF laser, a $YAlO_3$ laser, a glass laser, a ruby laser, an alexandrite laser, and a Ti: sapphire laser.

22. A method of manufacturing a semiconductor device according to claim 13, wherein the laser is one selected from the group consisting of an excimer laser, an Ar laser, and a Kr laser.

23. A method of manufacturing a semiconductor device according to claim 13, wherein the semiconductor device is at least one selected from the group consisting of a personal computer, a video camera, a mobile computer, a goggle type display, a player using a recording medium, a digital camera, a projector, a portable telephone, and an electronic book.

24. A method of manufacturing a semiconductor device comprising:
   forming a semiconductor film over a substrate;
   changing a sectional shape of a laser light emitted from a laser into a first shape by a means, wherein the first shape has an elongated cross section;
   homogenizing an energy density distribution in an end portion of the elongated cross section of the laser light by a mirror; and
   irradiating the semiconductor film with the laser light having the homogenized energy density distribution while relatively shifting the semiconductor film.

25. A method of manufacturing a semiconductor device according to claim 24, wherein the means comprises a homogenizer located to be orthogonal to an optical axis of the laser light.

26. A method of manufacturing a semiconductor device according to claim 24, wherein the means comprises a plurality of cylindrical lens arrays which are arranged in parallel so as to be orthogonal to an optical axis of the laser light and divide the laser light in the arrangement directions.

27. A method of manufacturing a semiconductor device according to claim 24, wherein the means comprises a plurality of cylindrical lens groups and a lens, wherein the cylindrical lens groups are arranged in parallel so as to be orthogonal to an optical axis of the laser light and divide the laser light in the arrangement directions, and wherein the lens is located in a transmission side of the cylindrical lens groups and synthesizes the divided laser lights.

28. A method of manufacturing a semiconductor device according to claim 24, wherein the means comprises a fly eye lens which is located to be orthogonal to an optical axis of the laser light and divides the laser light.

29. A method of manufacturing a semiconductor device according to claim 24, wherein the means comprises a fly eye lens and a spherical lens, wherein the fly eye lens is located to be orthogonal to an optical axis of the laser light and divides the laser light, and wherein the spherical lens is located in a transmission side of the fly eye lens and synthesizes the divided laser lights.

30. A method of manufacturing a semiconductor device according to claim 24, wherein the end portion of the laser light is a region parallel to a shift direction of the laser light.

31. A method of manufacturing a semiconductor device according to claim 24, wherein the laser comprises at least one selected from the group consisting of a continuous oscillation solid laser, a continuous oscillation gas laser, a pulse oscillation solid laser, and a pulse oscillation gas laser.

32. A method of manufacturing a semiconductor device according to claim 24, wherein the laser comprises at least one selected from the group consisting of a YAG laser, a $YVO_4$ laser, a YLF laser, a $YAlO_3$ laser, a glass laser, a ruby laser, an alexandrite laser, and a Ti: sapphire laser.

33. A method of manufacturing a semiconductor device according to claim 24, wherein the laser is one selected from the group consisting of an excimer laser, an Ar laser, and a Kr laser.

34. A method of manufacturing a semiconductor device according to claim 24, wherein the semiconductor device is at least one selected from the group consisting of a personal computer, a video camera, a mobile computer, a goggle type display, a player using a recording medium, a digital camera, a projector, a portable telephone, and an electronic book.

* * * * *